United States Patent
Toyozawa et al.

(10) Patent No.: US 7,116,307 B2
(45) Date of Patent: Oct. 3, 2006

(54) LEVEL CONVERTER CIRCUIT, DISPLAY DEVICE AND PORTABLE TERMINAL DEVICE

(75) Inventors: Noboru Toyozawa, Kanagawa (JP); Yoshiharu Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 483 days.

(21) Appl. No.: 10/450,935

(22) PCT Filed: Oct. 18, 2002

(86) PCT No.: PCT/JP02/10854

§ 371 (c)(1),
(2), (4) Date: Jun. 17, 2003

(87) PCT Pub. No.: WO03/036606

PCT Pub. Date: May 1, 2003

(65) Prior Publication Data

US 2004/0041777 A1   Mar. 4, 2004

(30) Foreign Application Priority Data

Oct. 19, 2001 (JP) ............................. 2001-322261
Oct. 19, 2001 (JP) ............................. 2001-322262

(51) Int. Cl.
G09G 3/36 (2006.01)
G09G 5/00 (2006.01)

(52) U.S. Cl. ..................................... 345/100; 345/211

(58) Field of Classification Search .......... 345/87–102, 345/204–213; G09G 3/36

See application file for complete search history.

(56) References Cited

U.S. PATENT DOCUMENTS

| | | | |
|---|---|---|---|
| 3,976,984 A * | 8/1976 | Hirasawa | 365/182 |
| 5,028,817 A * | 7/1991 | Patil | 326/27 |
| 5,684,750 A | 11/1997 | Kondoh et al. | |
| 5,955,893 A * | 9/1999 | Chang et al. | 326/71 |
| 6,191,779 B1 | 2/2001 | Taguchi et al. | |
| 6,580,411 B1 * | 6/2003 | Kubota et al. | 345/98 |

FOREIGN PATENT DOCUMENTS

| | | |
|---|---|---|
| JP | 51-99430 A | 9/1976 |
| JP | 06-090161 A | 3/1994 |
| JP | 11-030974 A | 2/1999 |

* cited by examiner

*Primary Examiner*—Alexander Eisen
(74) *Attorney, Agent, or Firm*—Robert J. Depke; Rockey, Depke, Lyons & Kitzinger LLC.

(57) ABSTRACT

This invention realizes reduction in consumption of DC current in a level converter circuit by setting level shifters in an operating state only when necessary in accordance with hierarchical control, in which an output pulse of a level shifter (311) that is constantly in a power-ON state is used to set a level shifter (321) of the next hierarchical level in the operating state, then output pulses of the level shifter (311) and the level shifter (321) are used to generate control pulses LT1 and LT2, which are used to set level shifters (341 to 346) of the next hierarchical level in the operating state, and an output pulse of one of the level shifters is used to set level shifters (351), (352) and (353) of the next hierarchical level in the operating state. Thus, a level converter circuit in which the consumption of DC current is reduced and which enables reduction in power consumption of the whole device, a display device equipped with this level converter circuit, and a portable telephone device using the display device as an output display unit can be constructed.

23 Claims, 14 Drawing Sheets

LEVEL CONVERTER CIRCUIT, DISPLAY DEVICE AND PORTABLE TERMINAL DEVICE

This application claims priority to International Application No. PCT/JP02/10854, filed Oct. 18, 2002, Japanese Patent Application Number JP2001-322261, filed Oct. 19, 2001, and Japanese Patent Application Number JP2001-322262, filed Oct. 19, 2001, each of which are incorporated herein by reference.

TECHNICAL FIELD

This invention relates to a level converter circuit, a display device and a portable terminal device, and particularly to a level converter circuit for performing level conversion (level shift) of various pulse signals with a first voltage amplitude to pulse signals with a second voltage amplitude that is different from the first voltage amplitude, a display device equipped with this circuit, and a portable terminal device using this display device as an output display unit.

BACKGROUND ART

Conventionally, as a display device, a so-called driving circuit-integrated liquid crystal display device is known in which, for example, a driving circuit for driving pixels of a pixel unit having pixels including liquid crystal cells arrayed in a matrix is integrally formed on a single board where the pixel unit is formed (liquid crystal display panel). In this driving circuit-integrated liquid crystal display device, a level converter circuit is provided which performs level conversion of various timing pulses with a low voltage amplitude of, for example, TTL level, inputted into the panel from a control IC provided outside the panel, to timing pulses with a high voltage amplitude necessary for driving the liquid crystal, and supplying the level-converted timing. pulses to the driving circuit.

The driving circuit for driving the pixel unit uses various timing pulses are used such as a vertical start pulse VST and a vertical clock pulse VCK for vertical scanning used when selectively driving the pixels of the pixel unit by row, and a write enable pulse WE for allowing writing of a signal to the pixels of the row selected through the vertical scanning. Since these timing pulses have different timing, the timing pulses are level-shifted by different level converter circuits.

Meanwhile, a liquid crystal display device is adapted for displaying an image by changing the molecular arrangement of liquid crystal on the basis of the presence/absence of an electric field and thus controlling transmission/interception of light. Theoretically, it is a display device of low power consumption type that does not need much electric power for driving. Therefore, it is broadly used as an output display unit for a portable terminal device such as a portable telephone unit or a PDA (personal digital assistant) using a battery as its mainpower. With respect to the liquid crystal display device for this type of application, reduction in power consumption based on lowering of the driving voltage and lowering of the driving frequency has been under way in order to enable use of the battery for a longer time period after charging it once.

In the above-described driving circuit-integrated liquid crystal display device, since separate level converter circuits for level-shifting various timing pulses are used constantly in the power-on state, an unnecessary DC current is consumed, obstructing reduction in power consumption of the whole driving circuit. Therefore, particularly in consideration of application to a portable terminal device such as a portable telephone unit or a PDA, reduction in power consumption of the liquid crystal display device itself is an important task to achieve in order to further reduce the power consumption of the portable terminal device.

The driving system of the display device, for example, a liquid crystal display device, includes a simple matrix system and an active matrix system. However, the active matrix, which has excellent response characteristics and visibility, has recently been used more often. In the liquid crystal display device of the active matrix system, when driving the liquid crystal display panel, a scanning line of a row (line) to which a signal is to be written is selected and then the signal is supplied from, for example, a driver IC provided outside the panel, thereby writing the signal to pixels decided as driving targets in the matrix.

If the signal line of the liquid crystal panel and the output of the driver IC provided outside the panel for driving the signal line are set in the relation of one-to-one correspondence, an IC driver having outputs of the number corresponding to the number of the signal lines must be prepared and wirings of the corresponding number are necessary for connecting the driver IC and the liquid crystal display panel. In view of this, a selector driving system is recently employed which allocates plural signal lines of the signal lines of the liquid crystal panel as a unit (set) to one output of the driver IC, time-divisionally selects the plural signal lines, and time-divisionally allocates and supplies the output signal of the driver IC to the selected signal lines.

Specifically, in this selector driving system, the output of the driver IC and the signal line of the liquid crystal display panel are set in the relation of one-to-N correspondence (N is an integer equal to or more than 2), and N signal lines allocated to one output signal of the driver IC selected and driven by N time division. By employing this selector driving system, it is possible to reduce the number of outputs of the driver IC and the number of wirings between the driver IC and the liquid crystal display panel to 1/N of the number of signal lines.

If the above-described selector driving system is employed in the so-called driving circuit-integrated liquid crystal display device in which the driving circuit for the pixel unit is integrally formed on a single board where the pixel unit is formed (liquid crystal display panel), a selector circuit for time-divisionally allocating one output signal of the driver IC to N signal lines is provided on the liquid crystal display panel. This selector circuit is switch-controlled (or selection-controlled) by a selector pulse supplied from outside.

Moreover, a level converter circuit for converting a signal with a low voltage amplitude of, for example, TTL level, supplied into the panel from an external IC to a signal with a high voltage amplitude necessary for driving the liquid crystal is provided on the liquid crystal display panel. The selector pulse is with a low voltage amplitude (for example, 0 to 3 V) of TTL level is inputted to the level converter circuit, where the selector pulse is level-shifted to a high voltage amplitude (for example, 0 to 7 V) necessary for driving the liquid crystal and supplied to the selector circuit for time-division control.

In the liquid crystal display device of the above-described selector driving system, conventionally, since the level converter circuit for performing level conversion (level shift) of the selector pulse with an external circuit power-supply voltage to an internal circuit power-supply voltage is used constantly in the power-on state, an unnecessary DC current is consumed, obstructing reduction in power consumption of the whole driving circuit. Therefore, particularly in consideration of application to a portable terminal device such as a portable telephone unit or a PDA, reduction in power consumption of the liquid crystal display device itself is an important task to achieve in order to further reduce the power consumption of the portable terminal device.

DISCLOSURE OF THE INVENTION

It is an object of the present invention to provide a level converter circuit which enables reduction in consumption of DC current and reduction in power consumption of the whole device, a display device equipped with this level converter circuit, and a portable terminal device using this display device as an output display unit.

It is another object of the present invention to provide a display device which enables reduction in consumption of DC current particularly in a level converter circuit and reduction in power consumption of the whole device in the case of employing the selector driving system, and a portable terminal device using this display device as a output display unit.

In order to achieve the foregoing object, a level converter circuit according to the present invention includes: a first circuit that is constantly in an operating state and performs level conversion of a first timing pulse that becomes active for a predetermined period, from a first voltage amplitude to a second voltage amplitude; and a second circuit that is in an operating state during an active period of the first timing pulse using the first timing pulse after the level conversion by the first circuit and performs level conversion of a second timing pulse from the first voltage amplitude to the second voltage amplitude.

This level converter circuit is provided on a driving circuit-integrated display device and is used for level conversion of a timing pulse with the first voltage amplitude inputted from outside of a board, to the second voltage amplitude. The driving circuit-integrated display device equipped with this level converter circuit is used as an output display unit of a portable terminal device.

In the above-described level converter circuit, the display device equipped with this level converter circuit, or the portable terminal device using this display device as an output display unit, the first circuit is constantly in the operating state while the second circuit is in the operating state to perform level conversion of the second timing pulse only during the active period of the first timing pulse. Thus, compared with the case where both the first and second circuits are constantly in the operating state, the consumption of a DC current in the level converter circuit can be reduced by the amount corresponding to the period when the second circuit is in the non-operating state.

In order to achieve the foregoing other object, a display device according to the present invention includes: a pixel unit having pixels arrayed in a matrix on a board and having signal lines arranged for each row of the pixel array; selection means provided on the same board (panel) as the pixel unit and adapted for time-divisionally selecting a set of plural signal lines and supplying a signal thereto; and level conversion means for converting a selector pulse with a first voltage amplitude inputted from outside the board to a second voltage amplitude and supplying the converted selector pulse to the selection means, the level conversion means being inactive when the selection means is in a non-selection state. This display device is used as-an output display unit of a portable terminal device.

In the display device of the above-described structure or the portable terminal device equipped with this display device as an output display unit, the selection means is not constantly in a selection state for the plural signal lines but sequentially repeats selection/non-selection. The selection/non-selection of the signal lines need not be continuously carried out one after another. It suffices to complete selection/non-selection sequentially within one horizontal scanning period, even at intervals between the signal lines. Therefore, the level converter circuit is inactive when the selection means is in the non-selection state. Thus, compared with the case where the level converter circuit is constantly active, the consumption of a DC current in the level conversion means can be reduced.

The other objects of the present invention and specific advantages provided by the present invention will be further clarified by the following description of embodiments described with reference to the drawings.

BEST MODE FOR CARRYING OUT THE INVENTION

Embodiments of the present invention will now be described in detail with reference to the drawings.

FIRST EMBODIMENT

Figure 1:
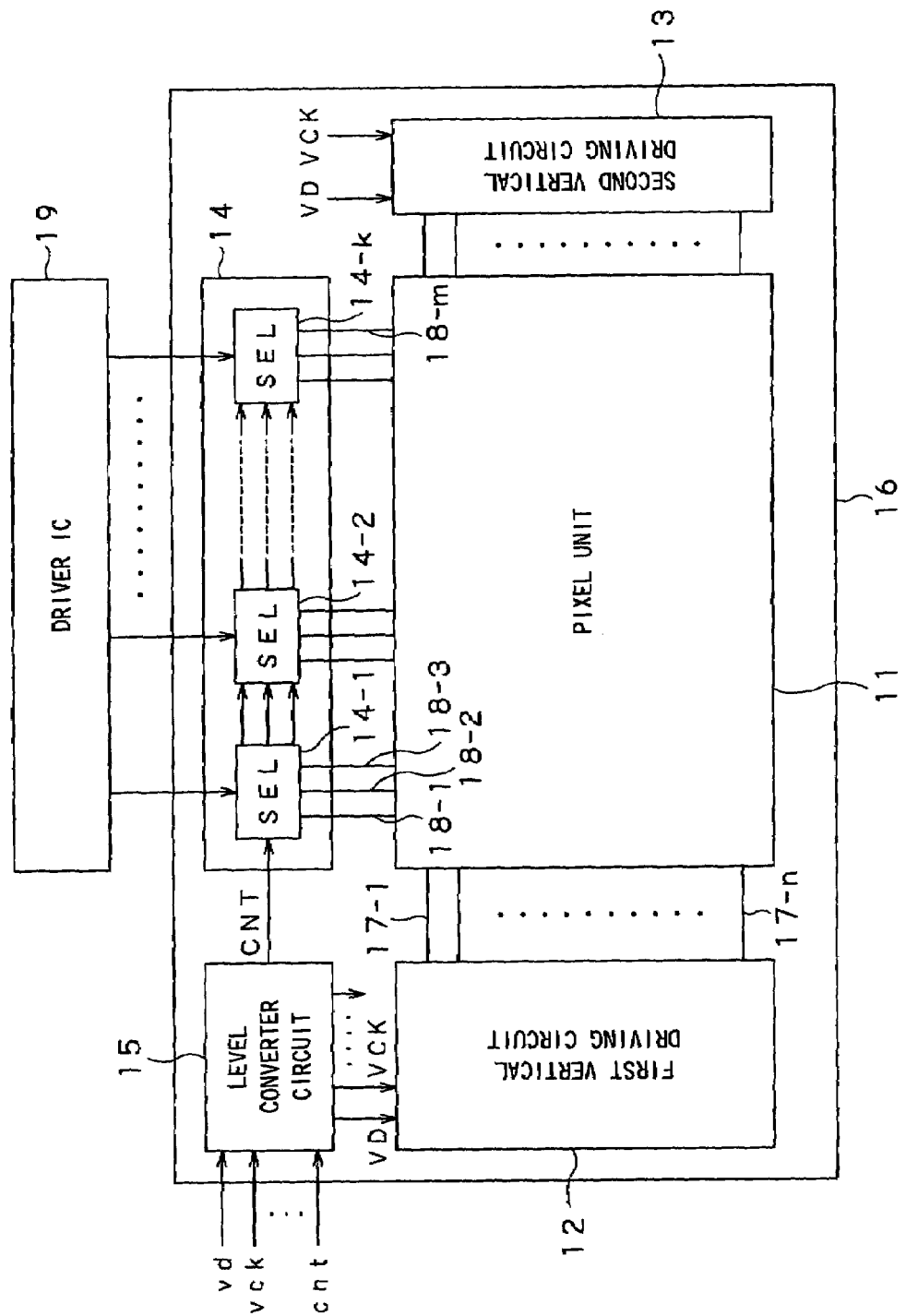
FIG. 1 is a block diagram showing a schematic overall structure of a liquid crystal display device according to a first embodiment of the present invention.

FIG. 1 is a block diagram showing the schematic overall structure of a display device according to a first embodiment of the present invention, for example, a liquid crystal display device using a liquid crystal cell as a pixel display element.

The liquid crystal display device according to this embodiment has a pixel unit 11 having pixel circuits including liquid crystal cell parts arrayed in a matrix, first and second vertical driving circuits 12, 13 for selectively driving the pixel circuits of the pixel unit 11 by row, a selector circuit 14 for selectively supplying an image signal to the pixel circuits of the row selectively driven by the vertical driving circuits 12, 13 while being drive-controlled in accordance with a selector driving system, which will be described later, and a level converter circuit 15 for performing level conversion of various timing pulses inputted from outside of a panel, as shown in FIG. 1.

The liquid crystal display device according to this embodiment has a driving circuit-integrated structure in which the first and second vertical driving circuits 12, 13, the selector circuit 14 and the level converter circuit 15 are integrally formed on a board (hereinafter referred to as liquid crystal panel) 16. The liquid crystal panel 16 has a structure formed by superposing a TFT board having, for example, thin film transistors (TFTs) formed thereon, which are switching elements of the respective pixel circuits, and a counter-board having a color filter and counter-electrodes formed thereon, and filling the space between these boards with liquid crystal.

In the pixel unit 11, n scanning lines 17-1 to 17-n and m signal lines 18-1 to 18-n are wired in a matrix with respect to a pixel arrangement of n rows and m columns, and pixel circuits are arranged at points of intersection. Under the selection control of the selector circuit 14, an alternated image signal is supplied to the respective pixel circuits of the pixel unit 11 through the signal lines 18-1 to 18-m. The alternately driven image signal is an image signal with its polarity inverted in a cycle centering a common voltage (signal center) VCOM in order to prevent deterioration of specific resistance (resistance value proper to a substance) or the like of the liquid crystal due to continuous application of a DC voltage of the same polarity to the liquid crystal.

Driving based on the alternately driven image signal is roughly classified into 1F inversion driving (where 1F is one field period) and 1H inversion driving (where 1H is one horizontal scanning period), depending on the timing of the polarity inversion of the image signal. 1F inversion driving is a driving method in which after an image signal of certain polarity is written to all the pixels, the polarity of the image signal is inverted. On the other hand, 1H inversion driving is a driving method in which the polarity of an image signal is inverted every line (every row) and also inverted every field.

In the liquid crystal display device according to this embodiment, as the alternated image signal, an analog image signal for normal display and digital image data for static image are properly supplied through the selector circuit 14 from a driver IC 19 provided outside the liquid crystal panel 16.

[Pixel Circuit]

Figure 2:
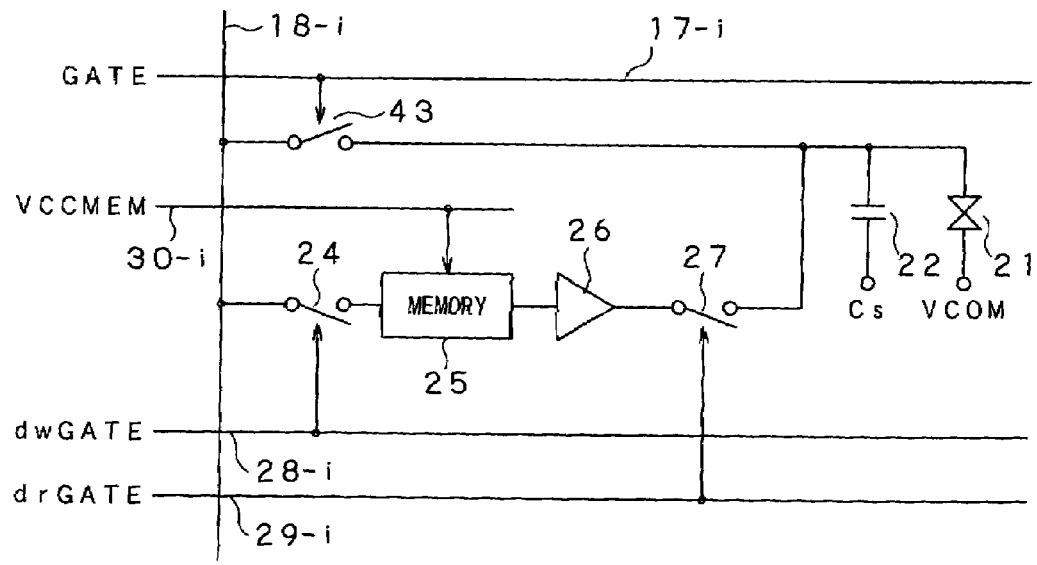
FIG. 2 is a circuit diagram showing an exemplary circuit structure of a pixel circuit constituting the liquid crystal display device according to the first embodiment of the present invention.

FIG. 2 is a circuit diagram showing an exemplary structure of the pixel circuit of the i-th row and the i-th column. This pixel circuit has a liquid crystal cell 21, a holding capacitance 22, a pixel selection switch 43, a data writing switch 24, a memory circuit 25, a data reading buffer 26 and a data reading switch 27.

The liquid crystal cell 21 and the holding capacitance 22 have their one-side ends commonly connected to form a liquid crystal cell part. A common voltage VCOM is applied to the other end of the liquid crystal cell 21 and an electric potential Cs with its polarity inverted every 1H or 1F is applied to the other end of the holding capacitance 22. The pixel selection switch 43 has its one end connected to a signal line 18-i and has its other end connected the one end of each of the liquid crystal cell 21 and the holding capacitance 22. The pixel selection switch 43 is driven by a scanning signal GATE provided via a signal line 17-i, thereby writing an analog image signal to the liquid crystal cell part.

The data writing switch 24 has its one end connected to the signal line 18-i and has its other end connected to the input end of the memory circuit 25. The data writing switch 24 is driven by a writing control signal dwGATE provided via a data writing control line 28-i, thereby writing digital image data to the memory circuit 25. The digital image data written in the memory circuit 25 is read out through the reading buffer 26. Hereinafter, the digital image data may be briefly referred to as memory data.

The data reading switch 27 has its one end connected to the output end of the reading buffer 26 and has its other end connected to the one end of each of the liquid crystal cell 21 and the holding capacitance 22. The data reading switch 27 is driven by a data reading control signal drGATE provided via a data reading control line 29-i, thereby writing the digital image data read out from the memory circuit 25 through the reading buffer 26, to the liquid crystal cell part. The memory circuit 25 is supplied with a power-supply voltage VCCMEM via a power control line 30-i.

The pixel circuit is not necessarily limited to the structure having a memory circuit but may have a basic structure made up of the liquid crystal cell 21, the holding capacitance 22 and a pixel transistor (TFT).

[Vertical Driving System]

A vertical driving system for selectively driving the pixels (pixel circuits) of the pixel unit 11 by the column is divided into the first vertical driving circuit 12 and the second vertical driving circuit 13, as seen from FIG. 1. Each of these vertical driving circuits 12, 13 handle the driving of two of the four wirings of the pixel circuit shown in FIG. 2, that is, the scanning line 17-i, the data writing control line 28-i, the data reading control line 29-i and the power control line 30-i. Specifically, the first vertical driving circuit 12 handles the driving of the scanning line 17-i and the data reading control line 29-i, and the second vertical driving circuit 13 handles the driving of the data writing control line 28-i and the power control line 30-i.

[Selector Circuit 14]

In the liquid crystal display device according to this embodiment, a selector driving system (time-division driving system) is used for driving the signal lines 18-1 to 18-m of the liquid crystal display panel 16. In this selector driving system, plural signal lines of the signal lines 18-1 to 18-m are allocated as a unit (set) to one output of the driver IC 19, and these plural signal lines are time-divisionally selected so that an output signal of the driver IC 19 is time-divisionally allocated and supplied to the selected signal lines.

Specifically, one output of the driver IC 19 and the signal lines 18-1 to 18-m are set in the relation of one-to-N correspondence (where N is an integer equal to or larger than two) and the N signal lines allocated to one output of the driver IC 19 are selected by N time division and thus driven. By employing this selector driving system, it is possible to reduce the number of outputs of the driver IC 19 and the number of wirings between the driver IC 19 and the liquid crystal display panel 16, to 1/N of the number of lines m of the signal lines 18-1 to 18-m.

To employ this selector driving system, adjacent plural signal lines of the signal lines 18-1 to 18-m are grouped as sets in the pixel unit 11. For example, in the case of the liquid crystal display panel 16 for color display in which the pixel circuits are arrayed horizontally as repetitions of B (blue), G (green) and R (red), each set consists of adjacent three signal lines (BGR) of the signal lines 18-1 to 18-i. That is, in this case, three-time-division driving is performed.

Meanwhile, the selector circuit 14 is supplied with color image signals of m/3 channels for the m signal lines 18-1 to 18-m from the driver IC 19 provided outside the liquid crystal display panel 16. That is, the driver IC 19 outputs, in time series, the BRG signals provided to the three signal lines of each corresponding set from each channel. The selector circuit 14 time-divisionally samples the time-series signals outputted every channel from the driver IC 19 and sequentially supplies the signals to each set of three signal lines.

Figure 3:
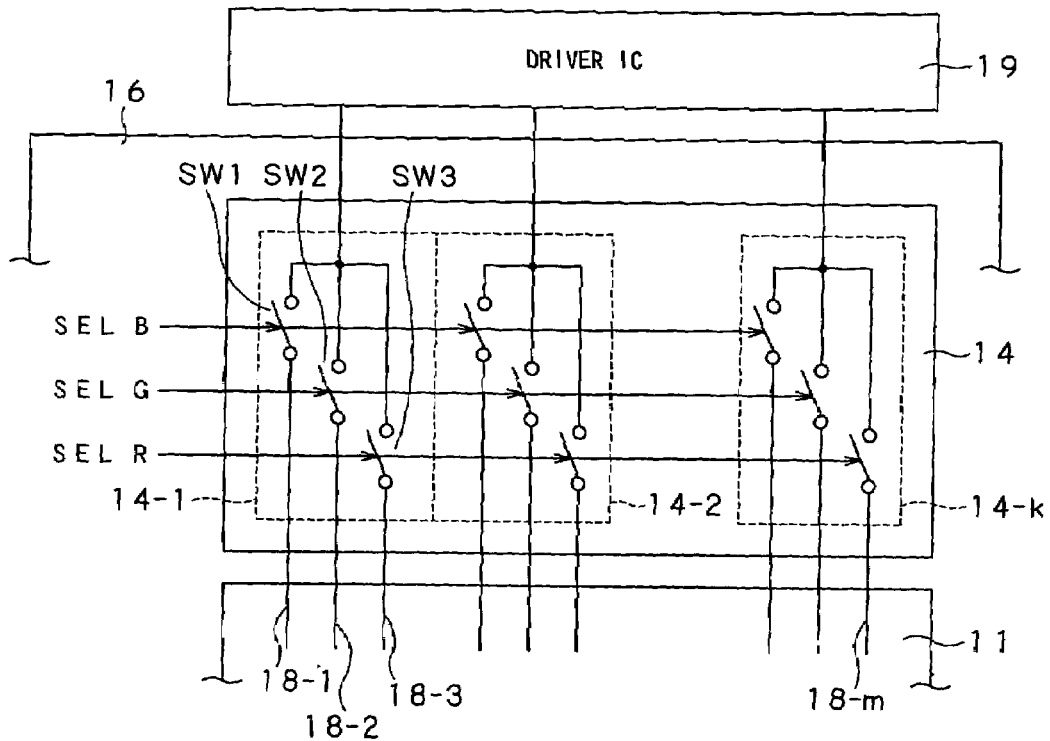
FIG. 3 is a conceptual view showing a three-time-division driving selector circuit constituting the liquid crystal display device according to the first embodiment.

FIG. 3 is a conceptual view of the three-time-division driving selector circuit 14. As shown in FIG. 3, the selector circuit 14 has a structure in which selectors (SEL) 14-1 to 14-k (where k=m/3) correspond to output lines of the driver IC 19, each selector being made up of three analog switches SW1, SW2, and SW3 connected between one output line of the driver IC 19 and each set of three signal lines and adapted for time-divisionally sampling the signals provided to the three signal lines.

When image signals for three pixels of BGR is outputted in time series to one output line of the driver IC 19, the image signals of this one BGR time series are sequentially allocated and supplied to the three signal lines by time division driving through the three analog switches SW1, SW2 and SW3. The three analog switches SW1, SW2 and SW3 are sequentially ON/OFF-driven by selector pulses SELB, SELG and SELR.

In the liquid crystal display device of the above-described structure, various timing pulses for controlling the driving circuits including the first and second vertical driving circuits 12, 13 and the selector circuit 14 are inputted with a low voltage amplitude (for example, 0 to 3 V) of, for example, TTL level, from a control IC (not shown) provided outside the liquid crystal display panel 16. These various timing pulses with a low voltage amplitude are level-converted by the level converter circuit 15 to timing pulses with a high voltage amplitude (for example, 0 to 7 V) necessary for driving the liquid crystal. This invention is characterized by the specific structure of the level converter circuit 15.

[Level Converter Circuit 15]

Figure 4:
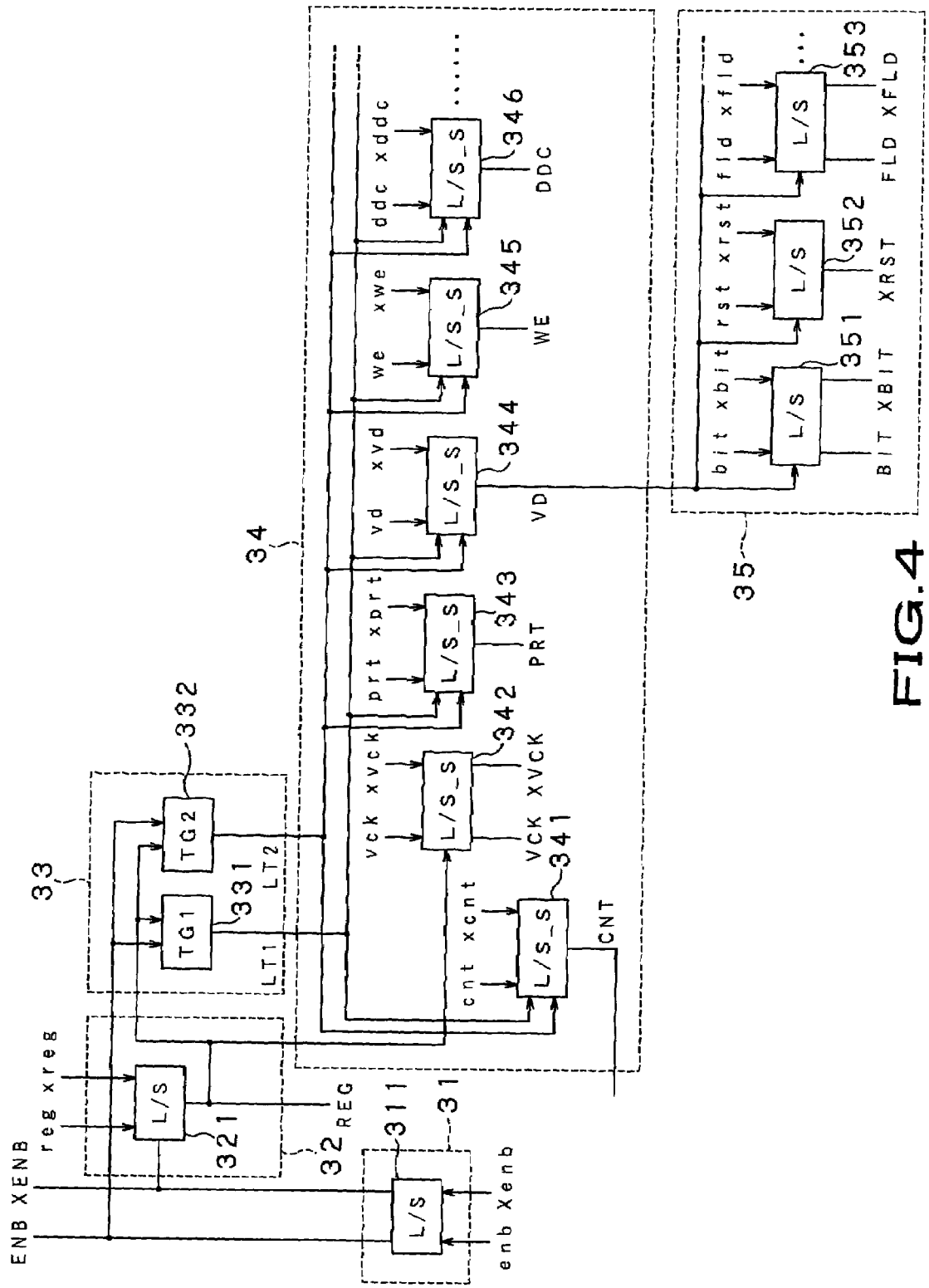
FIG. 4 is a block diagram showing a specific exemplary structure of a level converter circuit constituting the liquid crystal display device according to the first embodiment.

FIG. 4 is a block diagram showing a specific exemplary structure of the level converter circuit 15. To this level converter circuit 15, for example, an enable pulse enb, its inversion enable pulse xenb, a timing control pulse reg, a selector control pulse cnt, a vertical clock pulse vck, a partial control pulse prt, a vertical synchronizing pulse vd, a write enable pulse we, a DC-DC control pulse ddc, a bit pulse bit, a reset pulse rst, a memory control pulse fld and the like, and their inversion pulses are inputted.

The level converter circuit 15 according to this example includes a first level shift circuit 31, a second level shift circuit 32, a timing control circuit 33, a third level shift circuit 34, and a fourth level shift circuit 35. The level shift circuits 31, 32, 34 and 35 performs level conversion of the above-mentioned various timing pulses from a low voltage amplitude of, for example, 0 to 3 V, which is the voltage amplitude of an external circuit power source, to a high voltage amplitude (VDD level) of, for example, 0 to 7 V, which is the voltage amplitude of an internal circuit power source. The specific structures of the respective circuit parts will now be described.

(First Level Shift Circuit 31)

The first level shift circuit 31 includes a level shifter 311 that is in the operating state whenever the internal circuit power source is on. The level shifter 311 performs level shift of the enable pulse enb and its inversion enable pulse xenb of a low voltage amplitude to an enable pulse ENB and its inversion enable pulse XENB of a high voltage amplitude. The enable pulse ENB is a timing pulse that is at a low level during a horizontal blanking period of an image signal, as is clear from the timing chart of FIG. 5. The enable pulse ENB is supplied to the timing control circuit 33 and the first vertical driving circuit 12. The inversion enable pulse XENB is supplied to the second level shift circuit 32.

(Second Level Shift Circuit 32)

The second level shift circuit 32 includes a level shifter 321 having a known circuit structure based on a latch circuit. As the internal circuit power is supplied to the level shifter 321 only during the period when the inversion enable pulse XENB is supplied from the first level shift circuit 31 (low-level period of the enable pulse ENB), the level shifter 321 is in the operating state only during that period and performs level shift of the timing control pulse reg and its inversion control pulse xreg of a low voltage amplitude to a timing control pulse REG of a high voltage amplitude. This timing control pulse REG is supplied to the timing control circuit 33 and the level shift circuit 34.

(Timing Control Circuit 33)

The timing control circuit 33 includes two timing generators 331 and 332, each of which has two inputs of the enable pulse ENB and the timing control pulse REG. As is clear from the timing chart of FIG. 5, the timing generator 331 generates a control pulse LT1 that is at a high level during a period from the fall timing of the enable pulse ENB to the rise timing of the timing control pulse REG, and the timing generator 332 generates a control pulse LT2 that is at a high level during a period from the fall timing of the timing control pulse REG to the rise timing of the enable pulse ENB. These control pulses LT1 and LT2 are supplied to the third level shift circuit 34.

(Third Level Shift Circuit 34)

The third level shift circuit 34 includes, for example, six level shifters 341 to 346. However, the number of level shifter is not limited to six and an arbitrary number can be set when necessary. As the level shifters 341 to 346, for example, sampling latch-type level shifter are used. The specific circuit structure of the sampling latch-type level shifter will now be described.

Figure 6:
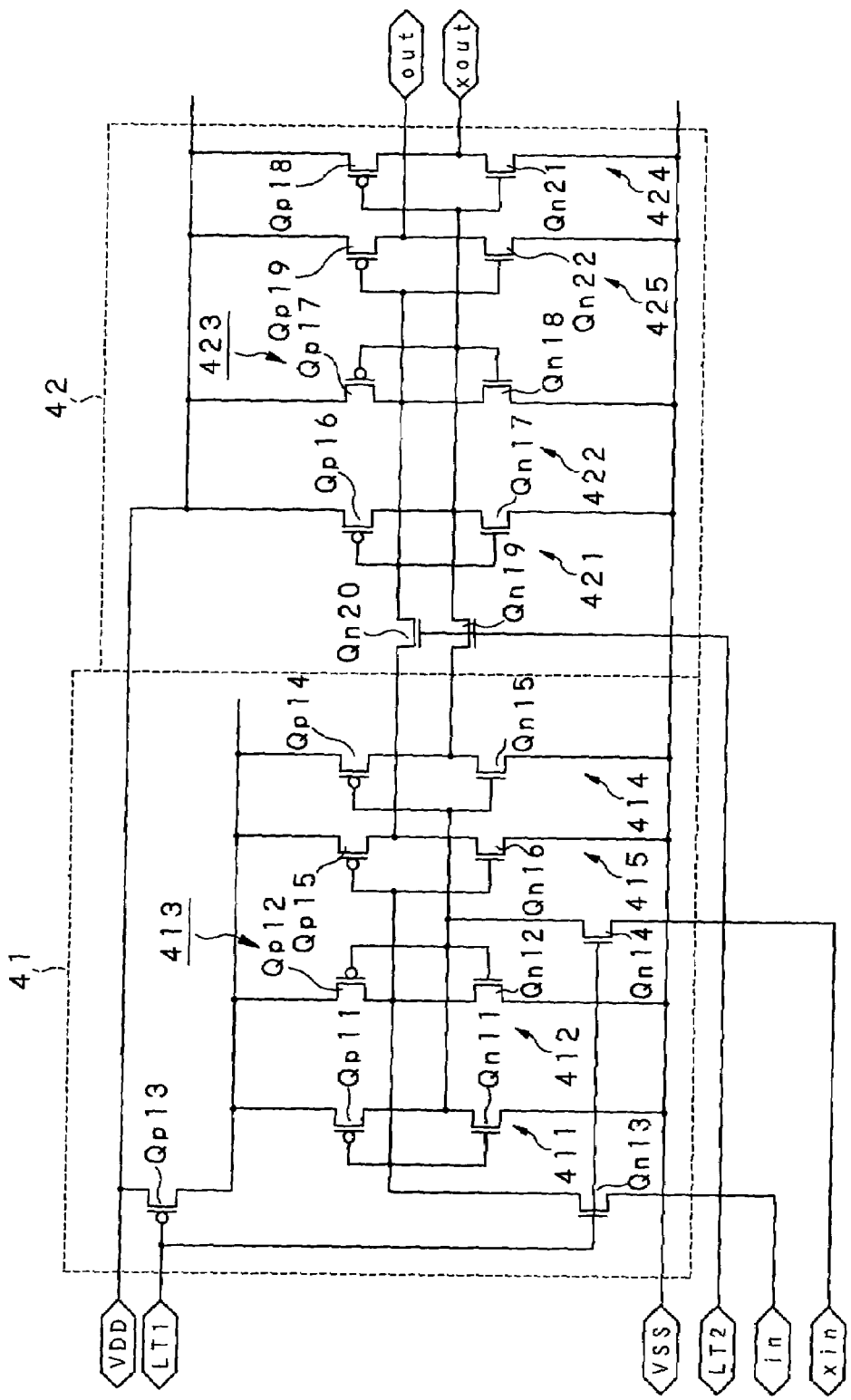
FIG. 6 is a circuit diagram showing a specific exemplary circuit of a sampling latch-type level shifter.

FIG. 6 is a circuit diagram showing a specific exemplary circuit structure of the sampling latch-type level shifter. The sampling latch-type level shifter according to this example includes a first latch circuit part 41 and a second latch circuit part 42, as shown in FIG. 6.

The first latch circuit part 41 has a CMOS latch cell 413 in which a CMOS inverter 411 including an NMOS transistor Qn11 and a PMOS transistor Qp11 with their respective gates and drains connected commonly, and a CMOS inverter 412 including an NMOS transistor Qn12 and a PMOS transistor Qp12 with their respective gates and drains connected commonly, are connected in parallel.

In this CMOS latch cell 413, the sources of the NMOS transistors Qn11 and Qn12 are connected to a negative power VSS. The sources of the PMOS transistors Qp11 and Qp12 are connected to a positive power VDD via a PMOS transistor Qp13. The common connection point of the gates of the NMOS transistor Qn11 and the PMOS transistor Qp11 is connected with the common connection point of the drains of the NMOS transistor Qn12 and the PMOS transistor Qp12 and is supplied with an input pulse in via an NMOS transistor Qn13.

The common connection point of the gates of the NMOS transistor Qn12 and the PMOS transistor Qp12 is connected with the common connection point of the drains of the NMOS transistor Qn11 and the PMOS transistor Qp11 and is supplied with the inversion input pulse xin of the input pulse in via an NMOS transistor Qn14. The above-described control pulse LT1 is applied to the gates of the PMOS transistor Qp13 and the NMOS transistors Qn13 and Qn14.

A latch pulse of a VDD level acquired at a node (1) is inverted and outputted by a CMOS inverter 414 including an NMOS transistor Qn15 and a PMOS transistor Qp14 with their respective gates and drains connected commonly. A latch pulse of a VDD level acquired at a node (2) is inverted and outputted by an NMOS inverter 415 including an NMOS transistor Qn16 and a PMOS transistor Qp15 with their respective gates and drains connected commonly.

On the other hand, the second latch circuit part 42 has a CMOS latch cell 423 as its basic structure, in which a CMOS inverter 421 including an NMOS transistor Qn17 and a PMOS transistor Qp16 with their respective gates and drains connected commonly, and a CMOS inverter 422 including an NMOS transistor Qn18 and a PMOS transistor Qp17 with their respective gates and drains connected commonly are connected in parallel between the positive power VDD and the negative power VSS.

In this CMOS latch cell 423, the common connection point of the gates of the NMOS transistor Qn17 and the PMOS transistor Qp16 is connected with the common connection point of the drains of the NMOS transistor Qn18 and the PMOS transistor Qp17 and is supplied with the inversion pulse of the node (2) of the CMOS latch cell 413 via an NMOS transistor Qn19.

The common connection point of the gates of the NMOS transistor Qn18 and the PMOS transistor Qp17 is connected with the common connection point of the drains of the NMOS transistor Qn17 and the PMOS transistor Qp16 and is supplied with the inversion pulse of the node (1) of the CMOS latch cell 413 via an NMOS transistor Qn20. The above-described control pulse LT2 is applied to the gates of the NMOS transistor Qn19 and the NMOS transistor Qn20.

A latch pulse at a node (3) is inverted to become an inversion output pulse xout by a CMOS inverter 424 including an NMOS transistor Qn21 and a PMOS transistor Qp18 with their respective gates and drains connected commonly. A latch pulse at a node (4) is inverted to become an output pulse out by a CMOS inverter 425 including an NMOS transistor Qn22 and a PMOS transistor Qp19 with their respective gates and drains connected commonly.

Figure 5:
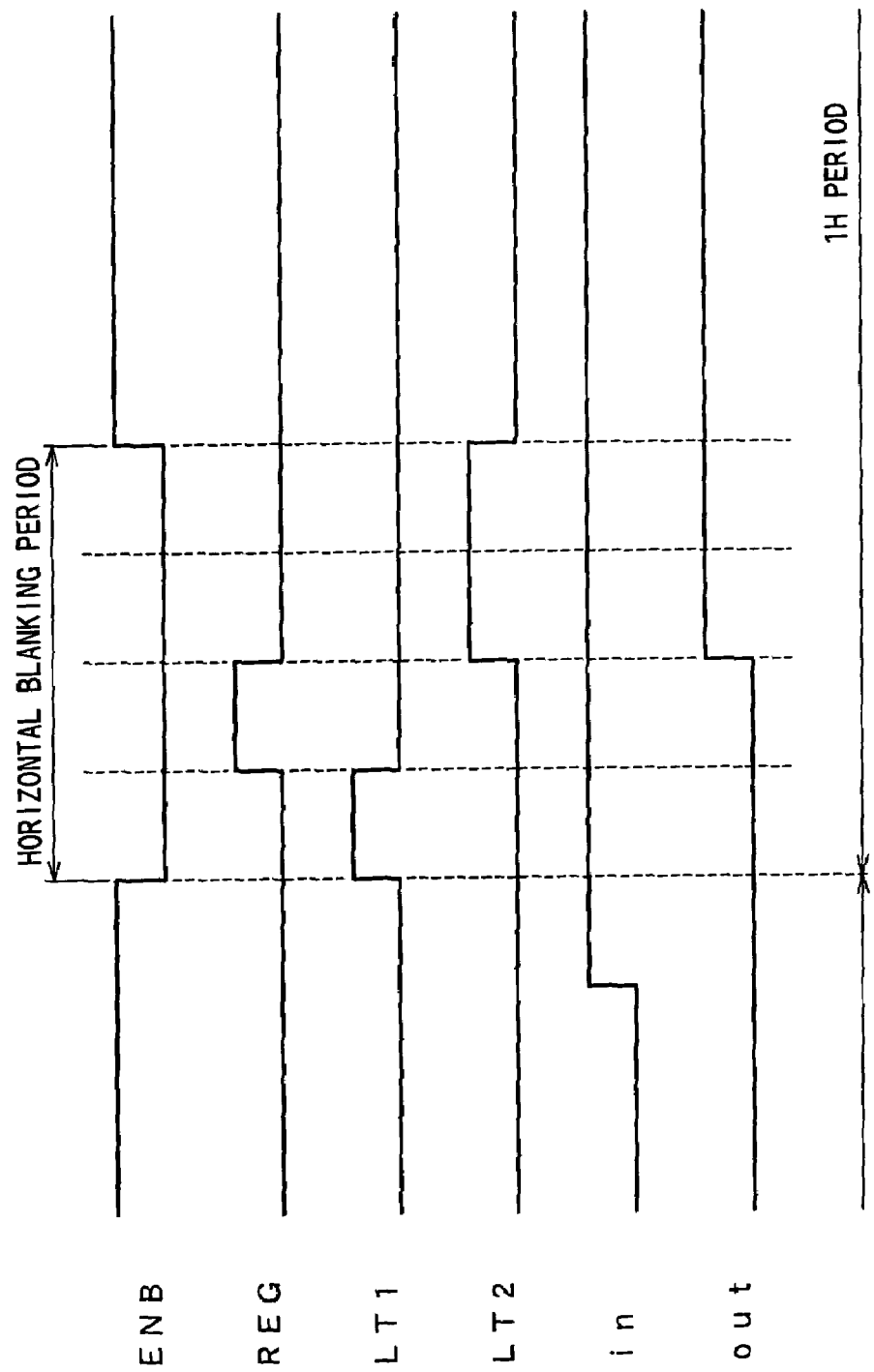
FIG. 5 is a timing chart (part 1) for explaining the operation of the level converter circuit.

The circuit operation of the sampling latch-type level shifter of the above-described structure will now be described with reference to the timing chart of FIG. 5.

As the control pulse LT1 of a high level is outputted from the timing generator 331 of the timing control circuit 33 during the high-level period (horizontal blanking period) of the enable pulse ENB, the PMOS transistor Qn13 of the first latch circuit part 41 is turned off and the supply of the positive power VDD to the CMOS latch cell 413 is shut down. At this point, as the NMOS transistors Qn13 and Qn14 are turned on by application of the high-level control pulse LT1, the input pulses in and xin are inputted to the CMOS latch cell 413.

When the control pulse LT1 shifts to a low level, that is, when the control pulse LT1 vanishes, the PMOS transistor Qp13 is turned on. As the supply of the positive power VDD to the CMOS latch cell 413 is started, and at the same time, the NMOS transistors Qn13 and Qn14 are turned off, the input pulses in and xin are latched by the CMOS latch circuit 413.

Subsequently, when the control pulse LT2 of a high level is outputted from the timing generator 332 of the timing control circuit 33, the NMOS transistors Qn19 and Qn20 of the second latch circuit part 42 are turned on. Therefore, the latched data in the CMOS latch cell 413 is supplied to the second latch circuit part 42 via the NMOS transistors Qn19 and Qn20 and latched by the CMOS latch cell 423. This latched data is outputted as output pulses out and xout.

In the third level shift circuit 34 using this sampling latch-type level shifter as the level shifters 341 to 346, the level shifter 341 performs level shift of the selector control pulse cnt and its inversion control pulse xcnt of a low voltage amplitude to a selector control pulse CNT of a high voltage amplitude. This selector control pulse CNT is supplied to the selector circuit 14 (see FIG. 1) and used for control to turn off the selector circuit 14.

The level shifter 342 performs level shift of the vertical clock pulse vck and its inversion clock pulse xvck of a low voltage amplitude to a vertical clock pulse VCK and its inversion clock pulse XVCK of a high voltage amplitude. These vertical clock pulses VCK and XVCK of the opposite phases are supplied to the first and second vertical driving circuits 12 and 13 and used as reference clocks for vertical scanning.

The level shifter 343 performs level shift of the partial control pulse prt and its inversion control pulse xprt of a low voltage amplitude to a partial control pulse PRT of a high voltage amplitude. This partial control pulse PRT is supplied to the first and second vertical driving circuits 12 and 13 and used for designating a region by line (row) in a partial display mode. The partial display mode is a partial screen display mode for presenting normal display of a part of a screen and white or black display of the remaining part of the screen.

Figure 7:
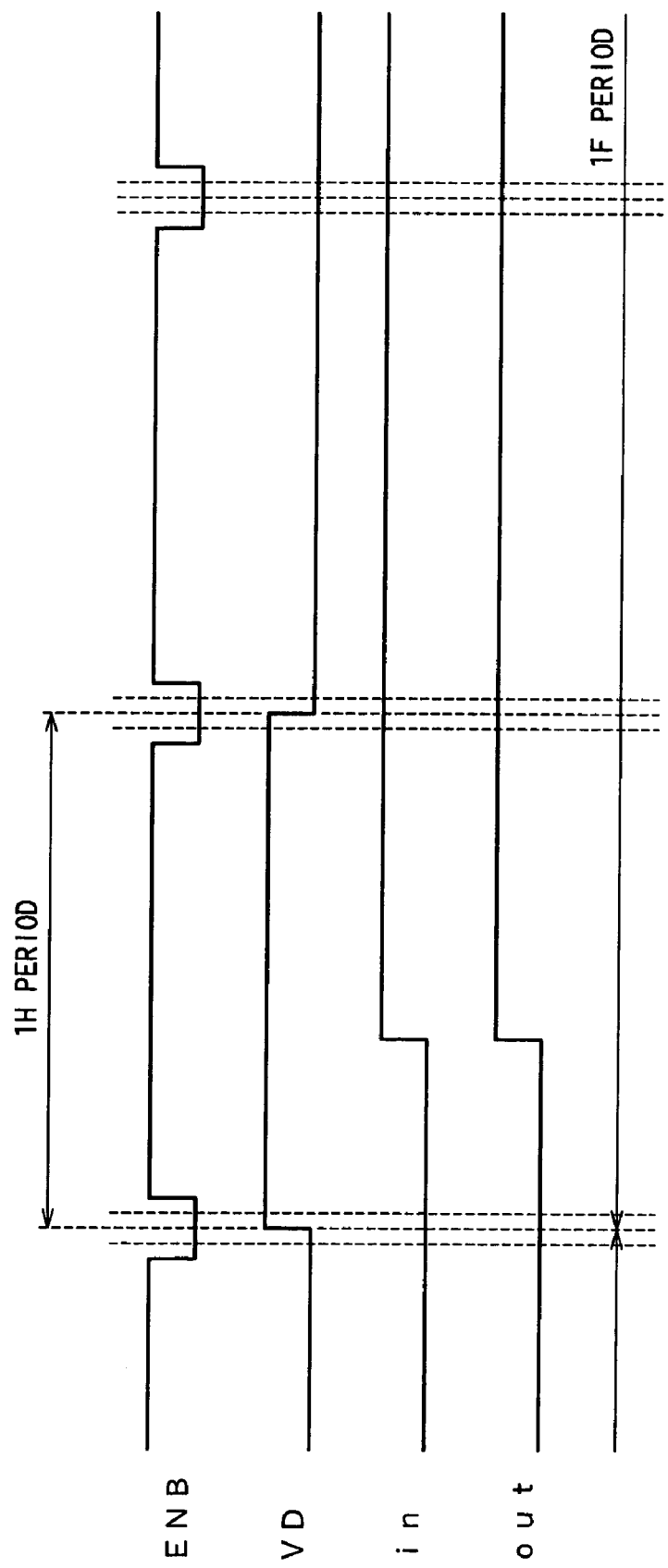
FIG. 7 is a timing chart (part 2) for explaining the operation of the level converter circuit.

The level shifter 344 performs level shift of the vertical synchronizing pulse vd and its inversion synchronizing pulse xvd of a low voltage amplitude to a vertical synchronizing pulse VD of a high voltage amplitude. This vertical synchronizing pulse VD is a pulse that is at a high level for one H period during 1F period, as shown in the timing chart of FIG. 7. The vertical synchronizing pulse VD is supplied to the first and second vertical driving circuits 12 and 13 and used as a vertical start pulse VST for instructing start-up of the shift registers constituting these circuits.

The level shifter 345 performs level shift of the write enable pulse we and its inversion enable pulse xwe of a low voltage amplitude to a write enable pulse WE of a high voltage amplitude. This write enable pulse WE is supplied to the second vertical driving circuit 13 and used for write control of a signal to each pixel circuit of the pixel unit 11.

The level shifter 346 performs level shift of the DC-DC control pulse ddc and its inversion control pulse xddc of a low voltage amplitude to a DC-DC control pulse DDC of a high voltage amplitude. This DC-DC control pulse DDC is used for controlling a DC-DC converter (not shown). This DC-DC converter is provided together with the level converter circuit 15 on the same board where the pixel unit 11 is provided. The DC-DC converter is adapted for generating a DC voltage such as negative power VSS, for example, on the basis of the internal circuit power VDD.

The timing pulses level-shifted in the third level shift circuit 34, that is, the selector control pulse CNT, the vertical clock pulse VCK, the partial control pulse PRT, the vertical synchronizing pulse VD, the write enable pulse WE and the DC-DC control pulse DDC are timing pulses that need to be level-shifted once in one H period.

(Fourth Level Shift Circuit 35)

The fourth level shift circuit 35 includes, for example, three level shifters 351, 352 and 353. However, the number of level shifters is not limited to three and an arbitrary number may be set when necessary. As each of the three level shifters 351, 352 and 353, a level shifter of a known circuit structure based on a latch circuit is used, similarly to the level shifter 321 constituting the second level shift circuit 32. These level shifters 351, 352 and 353 are in the operating state to perform a level shift operation when the above-described vertical synchronizing pulse VD is at a high level.

The level shifter 351 performs level shift of the bit pulse bit and its inversion pulse xbit of a low voltage amplitude to a bit pulse BIT of a high voltage amplitude. This bit pulse BIT is used for controlling the memory circuit 25 of the pixel circuit (see FIG. 2). The level shifter 352 performs level shift of the reset pulse rst and its inversion pulse xrst of a low voltage amplitude to a reset pulse RST of a high voltage amplitude. This reset pulse RST is used for resetting the entire driving circuit. The level shifter 353 performs level shift of the memory control pulse fld and its inversion pulse xfld of a low voltage amplitude to a memory control pulse FLD of a high voltage amplitude. This memory control pulse FLD is used for controlling the memory circuit 25.

The timing pulses level-shifted by the fourth level shift circuit 35, that is, the bit pulse BIT, the reset pulse RST and the memory control pulse FLD, are timing pulses that need to be level-shifted once in 1F period.

The timing pulses level-shifted once in 1H period by the third level shift circuit 34 are not limited to the selector control pulse CNT, the vertical block pulse VCK, the partial control pulse PRT, the vertical synchronizing pulse VD, the write enable pulse WE and the DC-DC control pulse DDC. Similarly, the timing pulses level-shifted once in 1F period by the fourth level shift circuit 35 are not limited to the bit pulse BIT, the reset pulse RST and the memory control pulse FLD.

(Effects of Level Converter Circuit 15)

As is clear from the above description, the control of the level shifters in the level converter circuit 15 of the above-described structure is so-called hierarchical control in which the individual level shifters are controlled to be in the operating state only during the period when the operating is necessary, as follows:

(1) using the output pulse of the level shifter 311, which is constantly in the power-ON state, the level shifter 321 on the next hierarchical level is set in the operating state;

(2) using the output pulses of the level shifter 311 and the level shifter 321, the control pulses LT1 and LT2 are generated;

(3) using these control pulses LT1 and LT2, the level shifters 341 to 346 on the next hierarchical level are set in the operating state; and (4) using one of the output pulses of the level shifters 341 to 346, the level shifters 351, 352 and 353 on the next hierarchical level are set in the operating state.

As this hierarchical control structure is employed, the following effects can be provided. First, since the level shifter 311 is provided, which is constantly in the power-ON state, and the enable pulse ENB after the level shift by this level shifter 311 is used to set the next level shifter 321 in the operating state only during the low-level period (active period) of the enable pulse ENB, and the electric potential in the latch circuit part in the level shifter 321 is held during the period after the level shift by the level shifter 321, the consumption of DC current in the level shifter 321 can be reduced except for the low-level period of the enable pulse ENB. Therefore, the power consumption in the level converter circuit 15 can be reduced.

Moreover, since the control pulses LT1 and LT2 that become active at different timing during the active period of the enable pulse ENB are generated by the timing generators 331 and 332 of the timing control circuit 33 on the basis of the output pulses of the level shifter 311 and the level shifter 321, that is, the enable pulse ENB and the timing control pulse REG, and these control pulses LT1 and LT2 are used to control the level shifters 341 to 346 constituted by sampling latch-type level shifters, the consumption of DC current in the level shifters 341 to 346 can be reduced.

Specifically, in the sampling latch-type level shifter shown in FIG. 6, in accordance with the control using the control pulses LT1 and LT2, the power VDD is not supplied to the CMOS latch cell 413 during the active period (high-level period) of the control pulse LT1 when the input pulses in and xin are taken in, and therefore the consumption of DC current in the CMOS latch cell 413 can be reduced to almost zero. Since the consumption of DC current is reduced in each of the level shifters 341 to 346, the reduction in consumption of DC current in the six level shifters is realized and the power consumption in the entire level converter circuit 15 can be significantly reduced.

Moreover, with respect to the timing pulses that need to be level-shifted only once in 1F, for example, the bit pulse BIT, the reset pulse RST and the memory control pulse FLD, the vertical synchronizing pulse VD, which is at a high level only for 1H period during 1F period, is used to set the level shifters 351, 352 and 353 in the operating state to perform level shift, thus enabling setting of the rise timing and fall timing of these pulses at arbitrary positions (times) in 1H period.

The level converter circuit according to the present invention has the power consumption reducing effect not only in the driving circuit-integrated display device. Therefore, the level converter circuit according to the present invention is not limited to the application to the level converter circuit provided in the driving circuit-integrated display device but can be generally applied to a level converter circuit having plural level shifters for performing level shift of various timing pulses of a first voltage amplitude to timing pulses of a second voltage amplitude that is different from the first voltage amplitude.

SECOND EMBODIMENT

Figure 8:
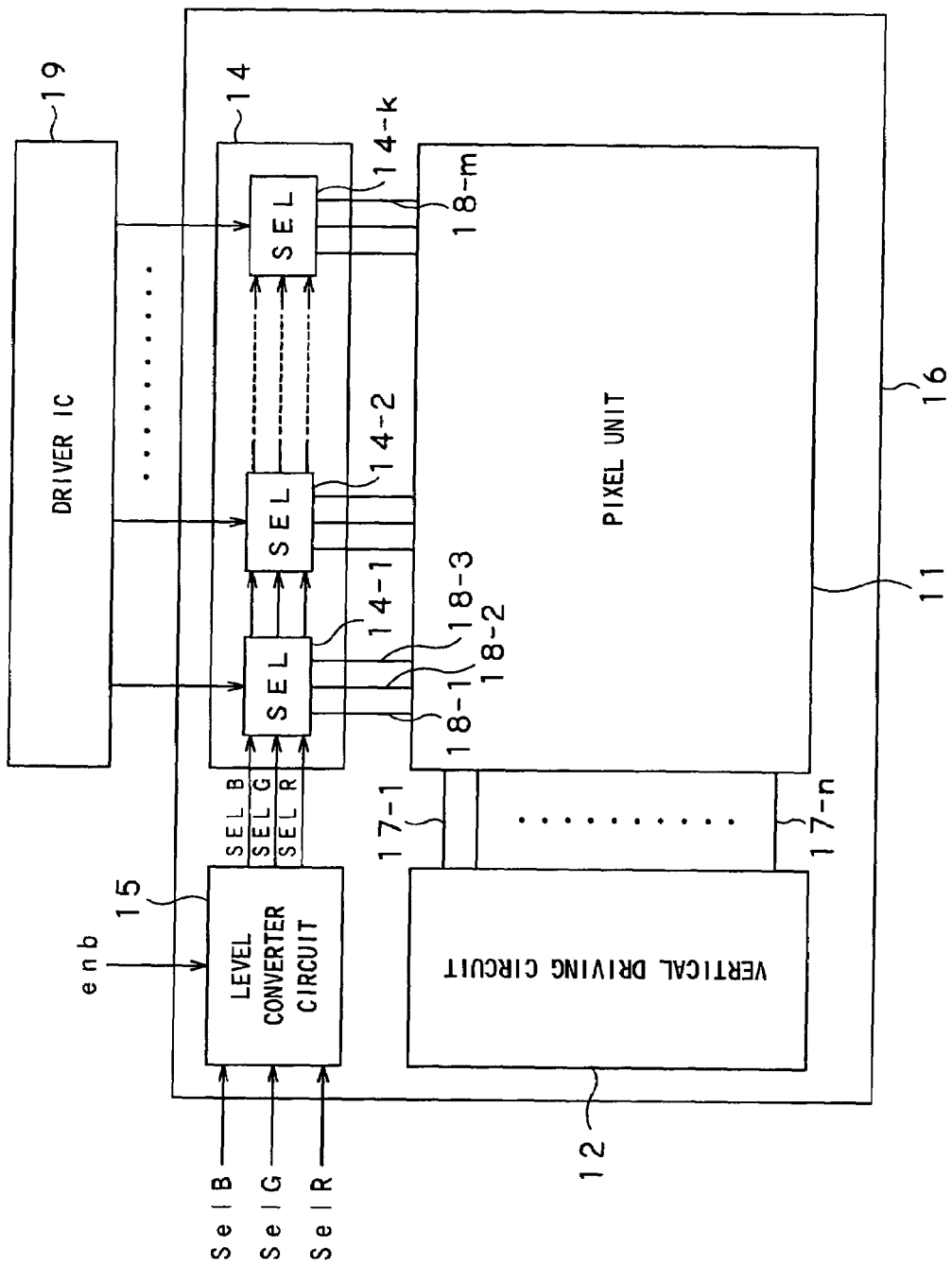
FIG. 8 is a block diagram showing a schematic overall structure of a liquid crystal display device according to a second embodiment of the present invention.

FIG. 8 is a block diagram schematically showing the overall structure of a display device according to a second embodiment of the present invention, for example, a liquid crystal display device. In FIG. 8, elements equivalent to those of FIG. 1 are denoted by the same numerals.

As shown in FIG. 8, the liquid crystal display device according to this embodiment has a pixel unit 11 having pixel circuits including liquid crystal cells arrayed in a matrix, a vertical driving circuit 12 for selectively driving the pixel circuits of the pixel unit 11 by row, a selector circuit 14 for selectively supplying an image signal to the pixels of the row selectively driven by the vertical driving circuit 12 while being drive-controlled in accordance with a selector driving system, and a level converter circuit 15 for performing level conversion (level shift) of a selector pulse for selectively driving the selector circuit 14.

The liquid crystal display device according to this embodiment has a driving circuit-integrated structure in which the vertical driving circuit 12, the selector circuit 14 and the level converter circuit 15 are integrally formed on a liquid crystal panel 16. The liquid crystal panel 16 has a structure formed by superposing a TFT board having switching elements of the respective pixel circuits such as thin film transistors (TFTs) formed thereon, and a counter-board having a color filter and counter-electrodes formed thereon, and filling the space between these transparent insulating boards (for example, glass boards) with a liquid crystal material.

[Pixel Circuit]

Figure 9:
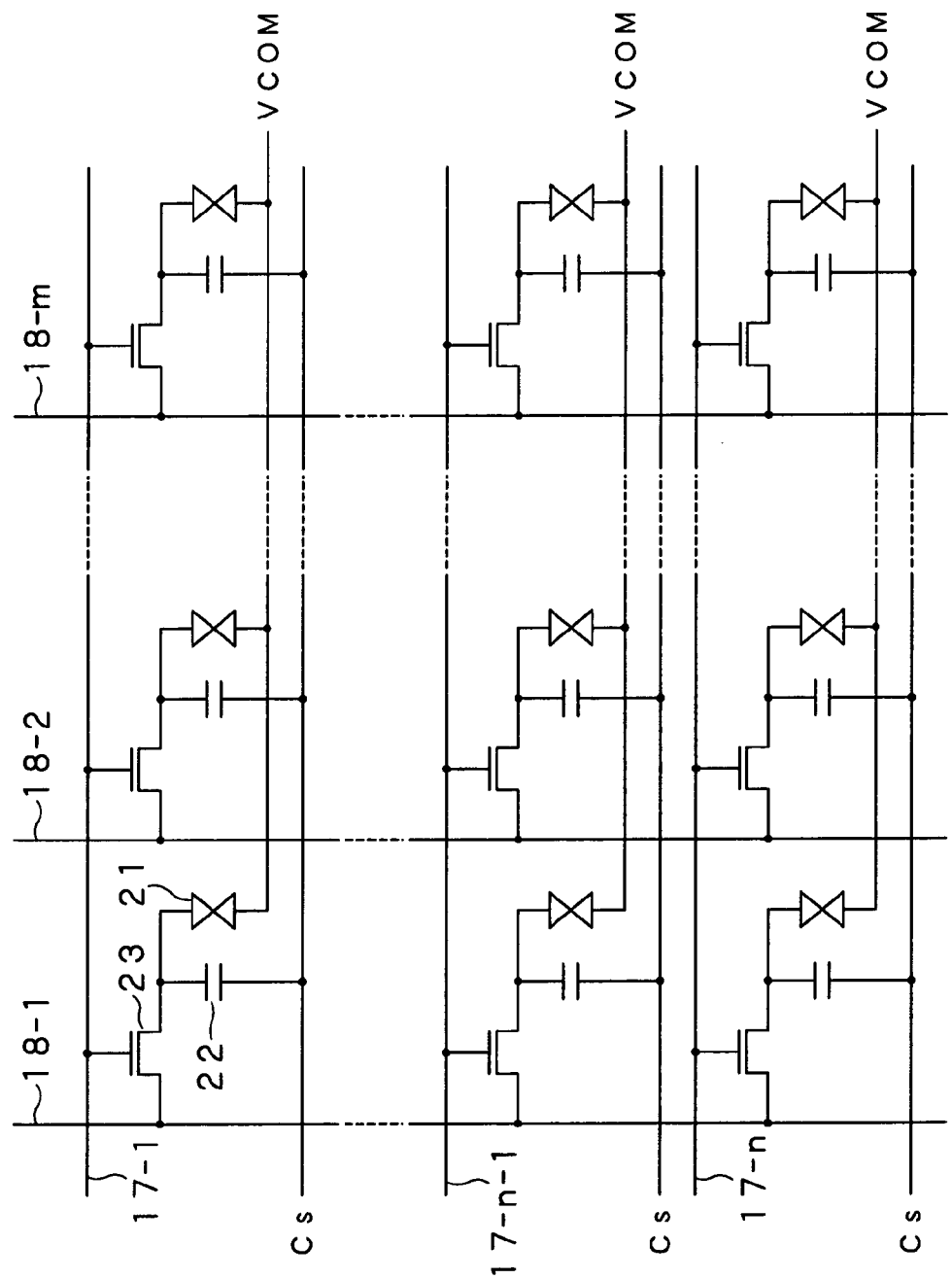
FIG. 9 is a circuit diagram showing a basic circuit structure of a pixel circuit constituting the liquid crystal display device according to the second embodiment of the present invention.

In the pixel unit 11, n scanning lines 17-1 to 17-n and m signal lines 18-1 to 18-n are wired in a matrix with respect to a pixel arrangement of n rows and m columns, and pixel circuits are arranged at points of intersection. The pixel circuit has a switching element for selecting a pixel, for example, a thin film transistor 23, a holding capacitance 22 having its one end connected to the drain of the thin film transistor 23, and a liquid crystal capacitance (liquid crystal cell) 21 having its pixel electrode connected to the drain of the thin film transistor 23, for example, as shown in FIG. 9.

The liquid crystal capacitance 21 is a capacitance generated between the pixel electrode formed by the thin film transistor 23 and the counter-electrode formed to face the pixel electrode. The thin film transistor 23 has its source connected to the corresponding one of the signal lines 18-1 to 18-m and has its gate connected to the corresponding one of the signal lines 17-1 to 17-n. A constant electric potential Cs is applied to the other end of the holding capacitance 22. A common voltage VCOM is applied to the counter-electrode of the liquid crystal capacitance 21.

While the pixel is described using a basic circuit structure as an example, the pixel circuit is not limited to this. For example, the liquid crystal display device may have a structure having a memory circuit for each pixel circuit so that it can deal with mixed display including normal display based on analog image signals and static image display based on digital image data held in the memory circuits, similarly to the liquid crystal display device according to the first embodiment.

[Vertical Driving System]

The vertical driving circuit 12 includes, for example, a shifter register, and performs vertical scanning by supplying a scanning pulse sequentially to the scanning lines 17-1 to 17-n of the pixel unit 11 and sequentially selecting the respective pixel circuits by row. In this example, the vertical driving circuit 12 is arranged on one side of the pixel unit 11. However, the vertical driving circuit may be arranged on both sides of the pixel unit 11, similarly to the liquid crystal display device according to the first embodiment. By employing the structure in which the vertical driving circuit is arranged on both sides, it is possible to prevent delay of the scanning pulse transmitted to the respective pixel circuits by row through the scanning lines 17-1 to 17n.

[Selector Circuit 14]

In the liquid crystal display device according to this embodiment, a selector driving system (time-division driving system) is used for driving the signal lines 18-1 to 18-m of the liquid crystal display panel 16. Therefore, in the pixel unit 11, plural adjacent signal lines of the signal lines 18-1 to 18-m are grouped as a set. For example, in the case of the liquid crystal display panel 16 for color display in which the pixel circuits are arrayed horizontally as repetitions of B (blue), G (green) and R (red), each set consists of adjacent three signal lines (BGR) of the signal lines 18-1 to 18-i. That is, in this case, three-time-division driving is performed.

Meanwhile, the selector circuit 14 is supplied with color image signals of m/3 channels for the m signal lines 18-1 to 18-m from a driver IC 19 provided outside the liquid crystal display panel 16. That is, the driver IC 19 outputs, in time series, the BRG signals provided to the three signal lines of each corresponding set from each channel. The selector circuit 14 time-divisionally samples the time-series signals outputted every channel from the driver IC 19 and sequentially supplies the signals to each set of three signal lines.

Figure 10:
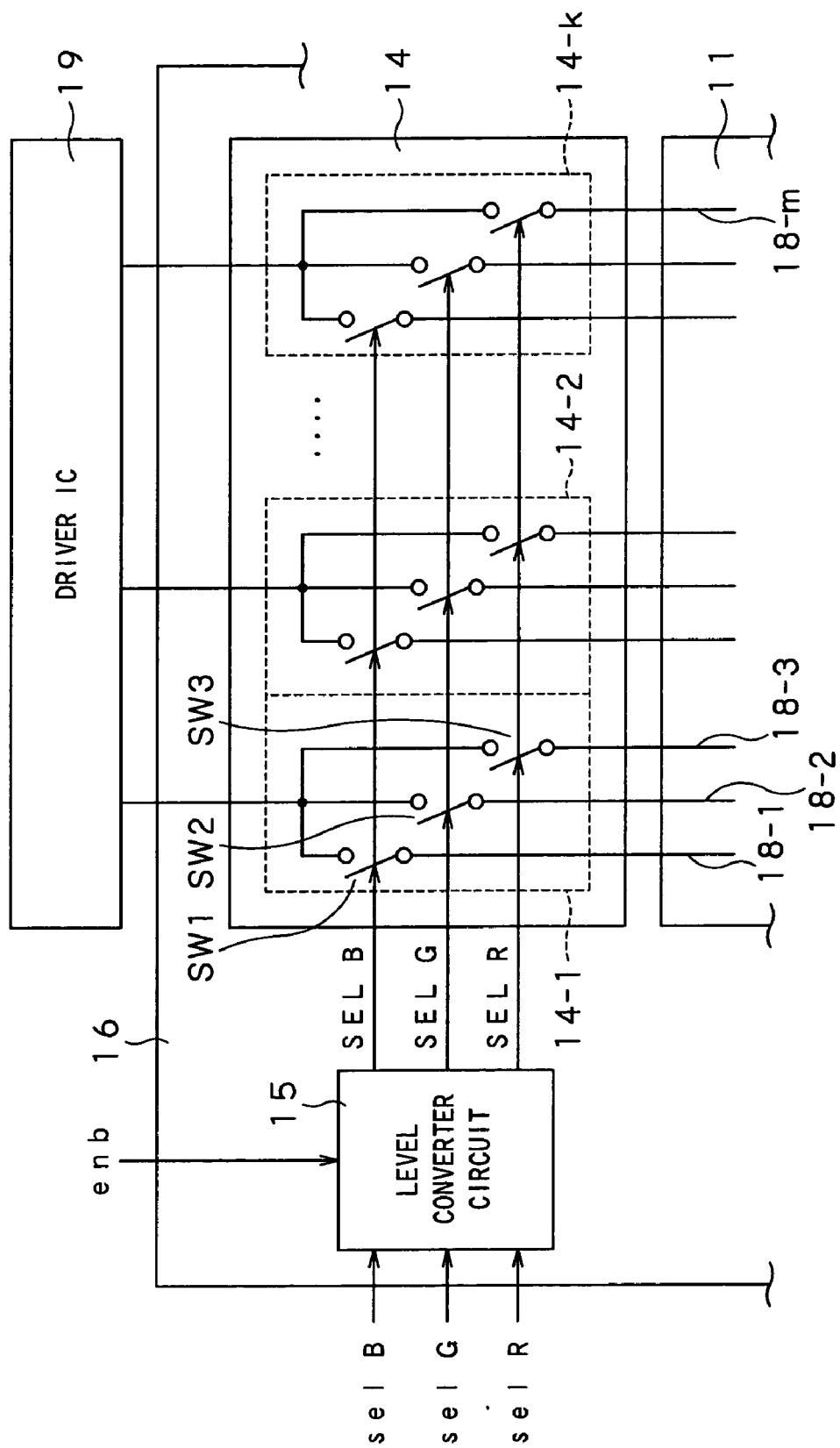
FIG. 10 is a conceptual view showing a three-time-division driving selector circuit constituting the liquid crystal display device according to the second embodiment of the present invention.

FIG. 10 is a conceptual view of the three-time-division driving selector circuit 14. As is clear from FIG. 10, the selector circuit 14 has a structure in which selectors 14-1 to 14-k (where k=m/3) correspond to output lines of the driver IC 19, each selector being made up of three analog switches SW1, SW2 and SW3 connected between one output line of the driver IC 19 and each set of three signal lines and adapted for time-divisionally sampling the signals provided to the three signal lines.

When image signals for three pixels of BGR is outputted in time series to one output line of the driver IC 19, the image signals of this one BGR time series are sequentially allocated and supplied to the three signal lines by time division driving through the three analog switches SW1, SW2 and SW3. The three analog switches SW1, SW2 and SW3 are sequentially ON/OFF-driven by selector pulses SELB, SELG and SELR. These selector pulses SELB, SELG and SELR are obtained as the level converter circuit 15 performs level conversion of selector pulses selB, selG and selR inputted from outside the liquid crystal display panel 16 (hereinafter simply referred to as "outside the panel") from an external circuit power-supply voltage (for example, 3 V) to an internal circuit power-supply voltage (for example, 7 V), which is a high voltage necessary for driving the liquid crystal.

[Level Converter Circuit 15]

Figure 11:
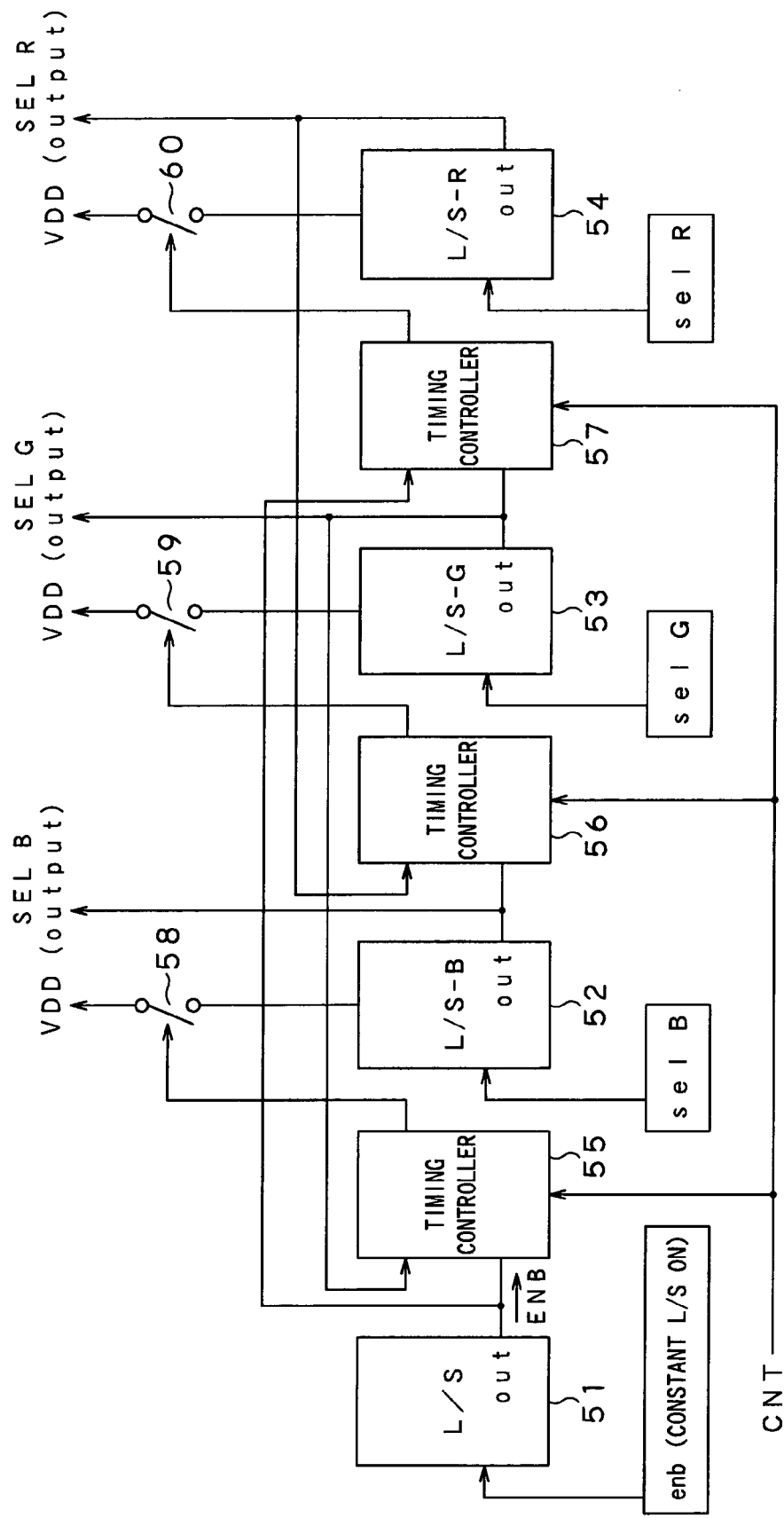
FIG. 11 is a block diagram showing a specific exemplary structure of a level converter circuit used for the liquid crystal display device according to the second embodiment of the present invention.

This embodiment is characterized by the specific structure of the level converter circuit 15. The structure and effect of the level converter circuit 15 will now be described. FIG. 11 is a block diagram showing a specific exemplary structure of the level converter circuit 15.

The level converter circuit 15 of this example has four level shifters (L/S) 51 to 54, three timing controllers 55 to 57, and three power switches 58 to 60. As the level shifters 51 to 54, a circuit structure based on a known latch circuit is used, which uses, for example, an internal circuit power-supply voltage VDD (hereinafter simply referred to as power-supply voltage VDD) as its operating power-supply voltage and which latches a pulse inputted with an internal circuit power-supply voltage, performs level shift (level conversion) of the inputted pulse to a pulse of the power-supply voltage VDD level and outputting the level-shifted pulse.

The level shifter 51 is constantly active (in the on-state) and performs level shift of an enable pulse enb of an external circuit power-supply voltage inputted from outside the panel to an enable pulse ENB of the power-supply voltage VDD. The level shifter 52, together with the timing controller 55, constitutes a circuit part corresponding to the selector pulse selB. The level shifter 53, together with the timing controller 56, constitutes a circuit part corresponding to the selector pulse selG. The level shifter 54, together with the timing controller 57, constitutes a circuit part corresponding to the selector pulse selR.

The timing controller 55 receives, as two inputs, the enable pulse ENB that has been level-shifted by the level shifter 51 and the selector pulse SELG that has been level-shifted by the level shifter 53, and performs ON (close)/OFF (open) control of the power switch 58 on the basis of the two pulses ENB and SELG. The power switch 58 controls supply/shutdown of the power-supply voltage VDD to the level shifter 52 under the ON/OFF control of the timing controller 55.

The level shifter 52 becomes active as the internal circuit power-supply voltage VDD is supplied thereto through the power switch 58. The level shifter 52 then performs level shift of the selector pulse selB of the external circuit power-supply voltage inputted from outside to the selector pulse SELB of the power-supply voltage VDD. The selector pulse SELB after the level shift is supplied to the analog switches SW1 of the above-described selectors 14-1 to 14-k. The level shifter 52 becomes inactive as the supply of the power-supply voltage VDD is shut down by the power switch 58.

The timing controller 56 receives, as two inputs, the selector pulse SELB that has been level-shifted by the level shifter 52 and the selector pulse SELR that has been level-shifted by the level shifter 54, and performs ON/OFF control of the power switch 59 on the basis of the two pulses SELB and SELR. The power switch 59 controls supply/shutdown of the power-supply voltage VDD to the level shifter 53 under the ON/OFF control of the timing controller 56.

The level shifter 53 becomes active as the internal circuit power-supply voltage VDD is supplied thereto through the power switch 59. The level shifter 53 then performs level shift of the selector pulse selG of the external circuit power-supply voltage inputted from outside to the selector pulse SELG of the power-supply voltage VDD. The selector pulse SELG after the level shift is supplied to the analog switches SW2 of the above-described selectors 14-1 to 14-k. The level shifter 53 becomes inactive as the supply of the power-supply voltage VDD is shut down by the power switch 59.

The timing controller 57 receives, as two inputs, the selector pulse SELG that has been level-shifted by the level shifter 53 and the enable signal ENB that has been level-shifted by the level shifter 51, and performs ON/OFF control of the power switch 60 on the basis of the two pulses SELG and ENB. The power switch 60 controls supply/shutdown of the power-supply voltage VDD to the level shifter 54 under the ON/OFF control of the timing controller 57.

The level shifter 54 becomes active as the internal circuit power-supply voltage VDD is supplied thereto through the power switch 60. The level shifter 54 then performs level shift of the selector pulse selR of the external circuit power-supply voltage inputted from outside to the selector pulse SELR of the power-supply voltage VDD. The selector pulse SELR after the level shift is supplied to the analog switches SW3 of the above-described selectors 14-1 to 14-k. The level shifter 54 becomes inactive as the supply of the power-supply voltage VDD is shut down by the power switch 60.

Figure 13:
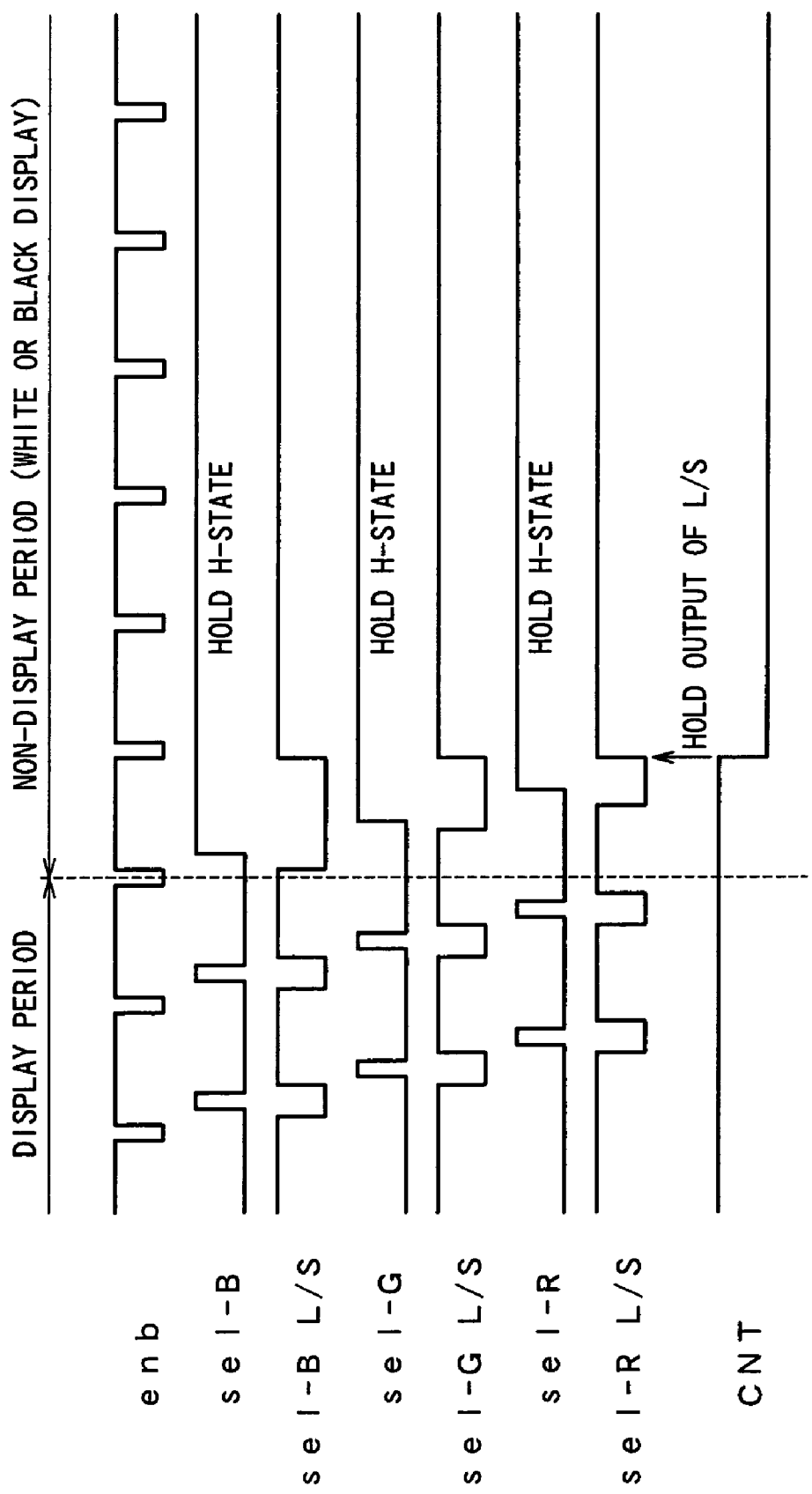
FIG. 13 is a timing chart (part 1) for explaining the operation in a partial display mode.
Figure 14:
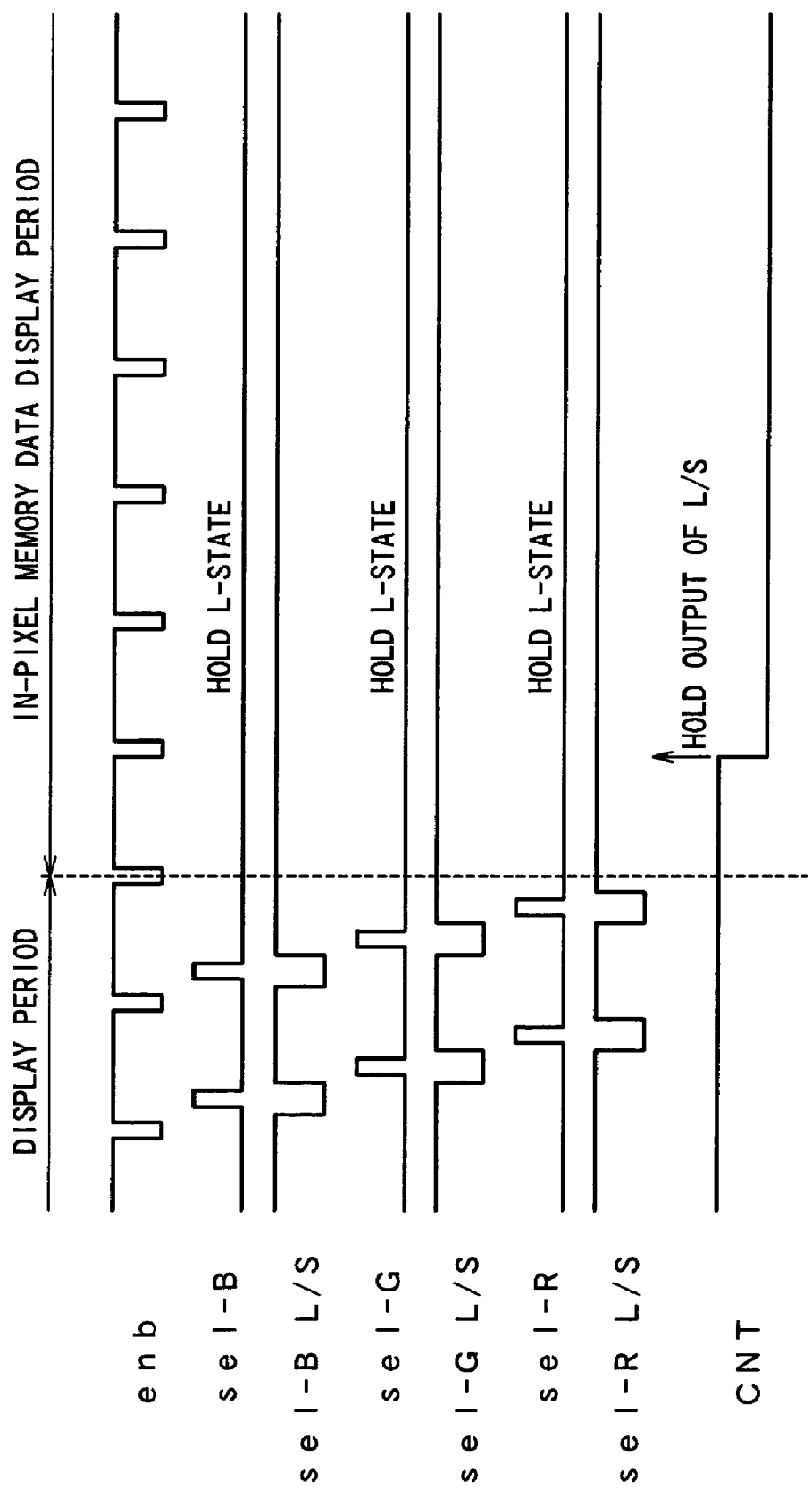
FIG. 14 is a timing chart (part 2) for explaining the operation in the partial display mode.

The timing controllers 55, 56 and 57 are supplied with a common control pulse CNT from outside. This control pulse CNT is a signal for collectively controlling the active/inactive state of the level shifters 52, 53 and 54. When the control pulse CNT is at a low (L) level, the level shifters 52, 53 and 54 become inactive and hold their outputs (see timing charts of FIGS. 13 and 14).

Figure 12:
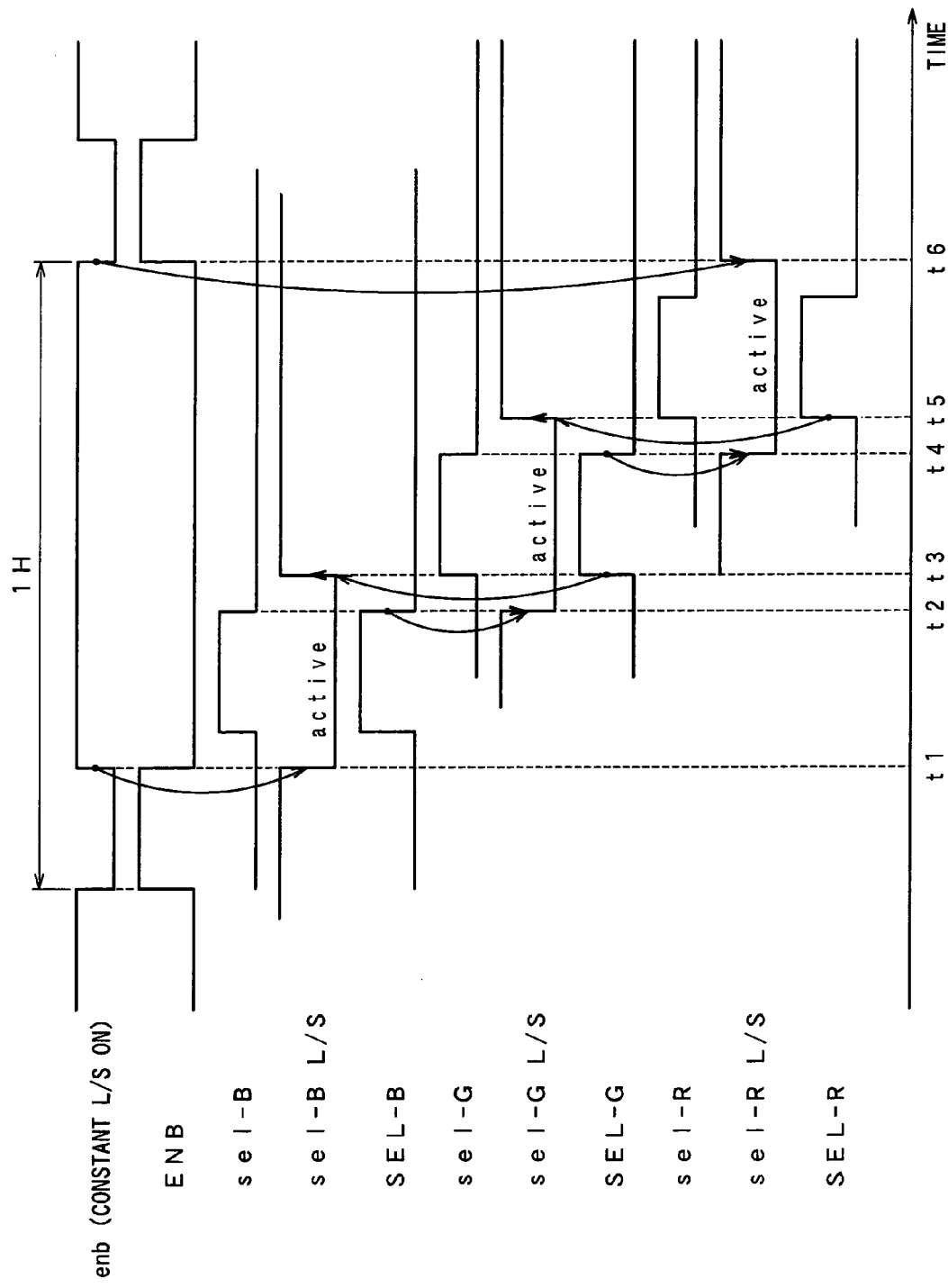
FIG. 12 is a timing chart for explaining the operation of the level converter circuit.

The circuit operation of the level converter circuit 15 of the above-described structure will now be described with reference to the timing chart of FIG. 12.

First, when the enable pulse enb which allows writing of a signal to the signal lines 18-1 to 18-m is inputted to the level shifter 51 from outside the panel in 1H period (H representing a horizontal scanning period), the level shifter 51 performs level shift of the enable pulse enb of the external circuit power-supply voltage to the enable signal ENB of the power-supply voltage VDD. The level-shifted enable signal ENB is inputted to the timing controllers 55 and 57.

When the enable signal ENB is inputted to the timing controller 55, the timing controller 55 turns on the power switch 58 at the fall timing t1 of the enable pulse ENB. This causes the power-supply voltage VDD to be supplied to the level shifter 52 through the power switch 58, and the level shifter 52 becomes active. As the selector pulse selB is inputted during this active period, the selector pulse selB is level shifted by the level shifter 52 to the selector pulse SELB of the power-supply voltage VDD, which is inputted to the timing controller 56.

When the selector pulse SELB is inputted to the timing controller 56, the timing controller 56 turns on the power switch 59 at the fall timing t2 of the selector pulse SELB. This causes the power-supply voltage VDD to be supplied to the level shifter 53 through the power switch 59, and the level shifter 53 becomes active. As the selector pulse selG is inputted during this active period, the selector pulse selG is level shifted by the level shifter 53 to the selector pulse SELG of the power-supply voltage VDD, which is inputted to the timing controllers 55 and 57.

When the selector pulse SELG is inputted to the timing controller 55, the timing controller 55 turns off the power switch 58 at the rise timing t3 of the selector pulse SELG. This shuts down the supply of the power-supply voltage VDD to lever shifter 52, and the level shifter 52 becomes inactive. That is, the level shifter 52 is active only during the period of level-shifting the selector pulse selB and is inactive otherwise.

When the selector pulse SELG is inputted to the timing controller 57, the timing controller 57 turns on the power switch 60 at the fall timing t4 of the selector pulse SELG. This causes the power-supply voltage VDD to be supplied to the level shifter 54 through the power switch 60, and the level shifter 54 becomes active. As the selector pulse selR is inputted during this active period, the selector pulse selR is level-shifted by the level shifter 54 to the selector pulse SELR of the power-supply voltage VDD, which is inputted to the timing controller 56.

When the selector pulse SELR is inputted to the timing controller 56, the timing controller 56 turns off the power switch 59 at the rise timing t5 of the selector pulse SELR. This shuts down the supply of the power-supply voltage VDD to the level shifter 53, and the level shifter 53 becomes inactive. That is, the level shifter 53 is active only during the period of level-shifting the selector pulse selG and is inactive otherwise.

When the enable pulse enb shifts to a low level and the enable signal ENB shifts to a high level, the timing controller 57 turns off the power switch 60 at the rise timing t6. This shuts down the supply of the power-supply voltage VDD to the level shifter 54, and the level shifter 54 becomes inactive. That is, the level shifter 54 is active only during the period of level-shifting the selector pulse selR and is inactive otherwise.

As is clear from the above-described operation, the level shifters 52, 53 and 54 are active only during the period of level-shifting the selector pulses selB, selG and selR, respectively, and are inactive otherwise. This means that the level converter circuit 15 including the level shifters 52, 53 and 54 is active only when the analog switches SW1, SW2 and SW3 of the selector circuit 14 are on (at the time of selection) and are inactive when the analog switches are off (at the time of non-selection).

In the selector circuit 14 for performing time division driving, the analog switches SW1, SW2 and SW3 are not constantly on but sequentially repeat the ON/OFF operation. The analog switches SW1, SW2 and SW3 need not perform the ON/OFF operation continuous to each other and may complete the ON/OFF operation in order within 1H period even with intervals between their respective ON/OFF operations.

In view of this, this embodiment employs the structure in which, at the time of non-selection of the selector circuit 14, the supply of the power-supply voltage VDD to the level shifters 52, 53 and 54 in the level converter circuit 15 is stopped so that the level shifters become inactive. As this structure is employed, since the level shifters 52, 53 and 54 consume no DC current in the level shifter circuit 15 during the period when the selector pulses selB, selG and selR need not be level-shifted, the power consumption in the level converter circuit 15 and hence the whole driving circuit can be reduced.

In the level converter circuit 15 of the above-described structure, the level shifter 51 for level-shifting the enable pulse enb, which allows writing of signals to the signal lines 18-1 to 18-m, is constantly active. Therefore, the enable pulse ENB after the level shift is constantly outputted from the level shifter 51, and the partial display mode (partial screen display mode), in which a part of the screen provides normal display while the remaining part of the screen provides white or black display, can also be used.

Specifically, for providing while or black display in the remaining part of the screen in the partial display mode, the selectors 14-1 to 14-k of the selector circuit 14 must be constantly in the selection state. In the display area, the sequence of the above-described circuit operation is taken, and in the non-display area, the level-shifted outputs of the selector pulses selB, selG and selR are latched from the initial stage of the non-display area, as shown in the timing chart of FIG. 13, thus setting the analog switches SW1, SW2 and SW3 constantly in the ON-state. Therefore, in the non-display period, a white or black signal can be constantly written and the conventional partial display can be made.

In the case each pixel has a memory, since the selectors 14-1 to 14-k of the selector circuit 14 need not be constantly in the selection state in the memory display part, the selectors can be constantly set in the non-selection state. In this case, in the effective display area, the sequence of the above-described circuit operation is taken, and in the memory display part, the level-shifted outputs (low-level outputs) of the selector pulses selB, selG and selR are latched from the initial stage of the non-display area, as shown in the timing chart of FIG. 14, thus setting the analog switches SW1, SW2 and SW3 constantly in the OFF-state. Therefore, in the memory display period, the DC power of the level shifters 51 to 54, the charge/discharge power of the selectors 14-1 to 14-k, and the charge/discharge power to the signal lines 18-1 to 18-m can be cut.

In the above-described first and second embodiments, the present invention is applied to the liquid crystal display device using liquid crystal cells as display elements of pixels. However, the present invention is not limited to the application to the liquid crystal display device and can also be applied generally to a driving circuit-integrated display device equipped with a level converter circuit, such as an EL display device using EL (liquid crystal display) elements as display elements of pixels.

<Exemplary Application>

Figure 15:
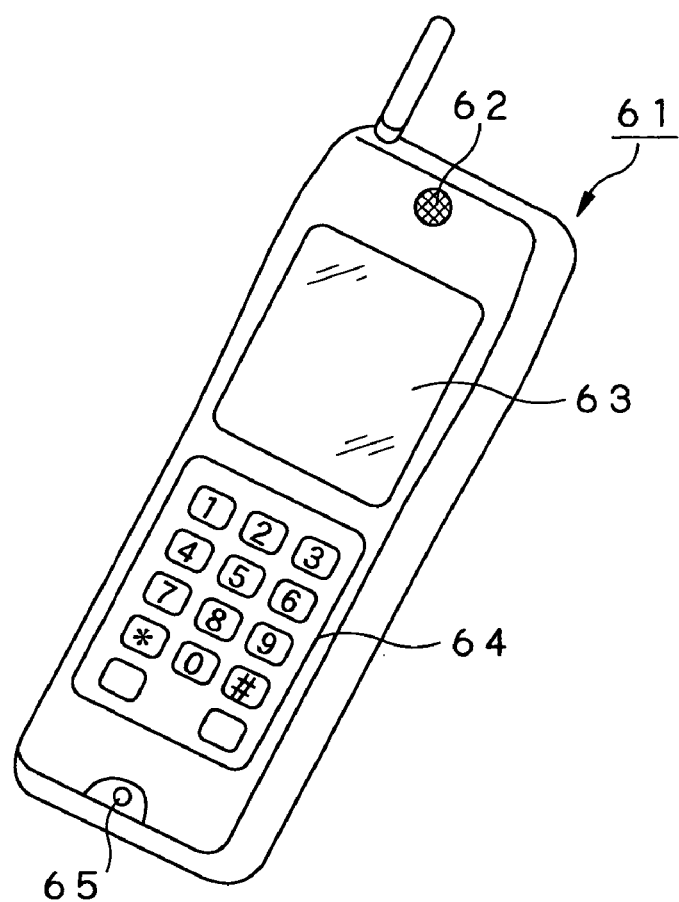
FIG. 15 is an appearance view showing a schematic structure of a portable telephone unit according to the present invention.

FIG. 15 is an appearance view showing the schematic structure of a portable terminal device according to the present invention, for example, a portable telephone unit.

The portable telephone unit according to this example includes a speaker part 62, an output display part 63, an operating part 64 and a microphone part 65, which are sequentially arranged from the top on the front side of a device casing 61. In the portable telephone unit of such a structure, for example, a liquid crystal display device is used for the output display part 63. As this liquid crystal display device, the liquid crystal display device according to the above-described first or second embodiment is used.

Figure 16:
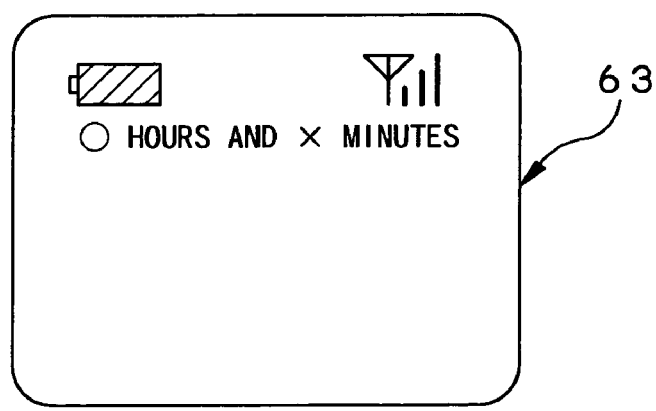
FIG. 16 is a view showing an exemplary display on an output display unit.

In the output display part 63 of the portable telephone unit of this type, a partial display mode for performing image display only in a partial area in the vertical direction of the screen is provided as a display function in a standby mode or the like. For example, in the standby mode, information such as the remaining power of the battery, the receiving sensitivity or time is constantly displayed in a partial area of the screen, as shown in FIG. 16. In the remaining display area, for example, white (or black) display is made.

In the portable telephone unit equipped with the output display part 63 having, for example, the partial display function, by thus using the above-described liquid crystal display device according to the first embodiment as the output display device 63 and using the above-described hierarchical control for controlling the level converter circuit including plural level shifters so that the level shifters are in the operating state only during the period when it is necessary, it is possible to reduce the power consumption by the amount of reduction in DC power consumption in the level converter circuit. Therefore, it is possible to use the battery as a main power source for a longer period of time by charging it once.

Moreover, by using the above-described liquid crystal display device according to the second embodiment as the output display part 63 and inactivating the level converter circuit (level shifters) at the time of non-selection of the selector, it is possible to reduce the power consumption by the amount of reduction in DC power consumption. Therefore, it is possible to use the battery for a longer period of time by charging it once.

While the present invention is applied to the example of the portable telephone unit, the present invention is not limited to this and can also be applied generally to a portable terminal device such as a secondary unit of an extension telephone or a PDA.

INDUSTRIAL APPLICABILITY

According to the present invention, since hierarchical control is used for controlling the level converter circuit including the plural level shifters so that the level shifters are in the operating state only during a period when it is necessary, the consumption of DC current in the level converter circuit can be reduced in comparison with the case where the level shifters are constantly in the operating state. Therefore, the power consumption of the whole device can be reduced by that amount.

Moreover, in the display device using the selector driving system for driving the signal lines of the pixel unit and having the level converter circuit for performing level conversion of selector pulses inputted from outside, the level converter circuit is inactivated at the time of none selection of the selector (selection means). Therefore, the consumption of DC current in the level converter can be reduced in comparison with the case where the level converter circuit is constantly active, and the power consumption of the whole device can be reduced by that amount.

The invention claimed is:

1. A level converter circuit comprising:
   a first circuit that is constantly in an operating state and performs level conversion of a first timing pulse that becomes active for a predetermined period, from a first voltage amplitude to a second voltage amplitude; and
   a second circuit that is in an operating state during an active period of the first timing pulse using the first timing pulse after the level conversion by the first circuit and performs level conversion of a second timing pulse from the first voltage amplitude to the second voltage amplitude further comprising:
   a timing control circuit for generating a control pulse that becomes active during the active period of the first timing pulse on the basis of the first and second timing pulses after the level conversion by the first and second circuits; and
   a third circuit that is in an operating state during an active period of the control pulse using the control pulse and performs level conversion of a third timing pulse from the first voltage amplitude to the second voltage amplitude.

2. The level converter circuit as claimed in claim 1 wherein the third circuit includes plural circuit parts corresponding to plural said third timing pulses.

3. The level converter circuit as claimed in claim 1, wherein the timing control circuit generates first and second control pulses that become active at different timing during the active period of the first timing pulse, and
   the third circuit is a sampling latch-type level shifter that is in a non-operating state during an active period of one of the first and second control pulses that is generated first and then takes the third timing pulse therein, and that is in an operating state when the control pulse is inactive, then latches the control pulse, and latches the latched data on a subsequent stage synchronously with the control pulse that is generated later.

4. The level converter circuit as claimed in claim 1 further comprising a fourth circuit that is in an operating state during an active period of the third timing pulse using the third timing pulse after the level conversion by the third circuit and performs level conversion of a fourth timing pulse from the first voltage amplitude to the second voltage amplitude.

5. The level converter circuit as claimed in claim 4 wherein the fourth circuit includes plural circuit parts corresponding to plural said fourth timing pulses.

6. A display device comprising a pixel unit having pixels arrayed in a matrix on a board, driving means provided on the same board as the pixel unit and adapted for driving the pixels of the pixel unit, and a level converter circuit for performing level conversion of a timing pulse of a first voltage amplitude inputted from outside the board to a second voltage amplitude and supplying the level-converted timing pulse to the driving means,
   the level converter circuit comprising:
   a first circuit that is constantly in an operating state and performs level conversion of a first timing pulse that becomes active during a horizontal blanking period of an image signal, from the first voltage amplitude to the second voltage amplitude; and
   a second circuit that is in an operating state during an active period of the first timing pulse using the first timing pulse after the level conversion by the first circuit and performs level conversion of a second timing pulse from the first voltage amplitude to the second voltage amplitude wherein the level converter circuit further comprises:
   a timing control circuit for generating a control pulse that becomes active during the active period of the first timing pulse on the basis of the first and second timing pulses after the level conversion by the first and second circuits; and
   a third circuit that is in an operating state during an active period of the control pulse using the control pulse and performs level conversion of a third timing pulse from the first voltage amplitude to the second voltage amplitude.

7. The display device as claimed in claim 6 wherein the third circuit includes plural circuit parts corresponding to plural said third timing pulses.

8. The display device as claimed in claim 6 wherein the timing control circuit generates first and second control pulses that become active at different timing during the active period of the first timing pulse, and
   the third circuit is a sampling latch-type level shifter that is in a non-operating state during an active period of one of the first and second control pulses that is generated first and then takes the third timing pulse therein, and that is in an operating state when the control pulse is inactive, then latches the control pulse, and latches the latched data on a subsequent stage synchronously with the control pulse tat is generated later.

9. The display device as claimed in claim 7 wherein one of the third timing pulses is a pulse that is active during one horizontal scanning period in one field period.

10. The display device as claimed in claim 9 wherein the level converter circuit further comprises a fourth circuit that is in an operating state during an active period of the third timing pulse using the third timing pulse after the level conversion by the third circuit and performs level conversion of a fourth timing pulse from the first voltage amplitude to the second voltage amplitude.

11. The display device as claimed in claim 10 wherein the fourth circuit includes plural circuit parts corresponding to plural said fourth timing pulses.

12. The display device as claimed in claim 6, wherein display elements of the pixels are liquid crystal cells.

13. A display device comprising:
a pixel unit having pixels arrayed in a matrix on a board and having signal lines arranged for each row of the pixel array;
selection means provided on the same board as the pixel unit and adapted for time-divisionally selecting a set of plural signal lines and supplying a signal thereto; and
level conversion means for converting a selector pulse with a first voltage amplitude inputted from outside the board to a second voltage amplitude and supplying the converted selector pulse to the selection means, the level conversion means being inactive when the selection means is in a non-selection state and wherein the level conversion means has a first level shifter that becomes active in response to an enable pulse allowing supply of a signal to the signal lines and performs level shift of a first shift pulse, a second level shifter that becomes active at timing of vanishing of the first shift pulse level-shifted by the first level shifter and performs level shift of a second shift pulse, and a third level shifter that becomes active at timing of vanishing of the second shift pulse level-shifted by the second level shifter and performs level shift of a third shift pulse,
the first level shifter becoming inactive at timing of generation of the second shift pulse, the second level shifter becoming inactive at timing of generation of the third shift pulse, and the third level shifter becoming inactive at timing of vanishing of the enable pulse.

14. The display device as claimed in claim 13 wherein the level conversion means has an enable pulse level shifter that is constantly active, performs level shift of the enable pulse of the first voltage level inputted from outside of the board to the second voltage level and supplies the level-shifted enable pulse to the first level shifter.

15. A portable telephone device using, as an output display unit, a display device comprising a pixel unit having pixels arrayed in a matrix on a board, driving means provided on the same board as the pixel unit and adapted for driving the pixels of the pixel unit, and a level converter circuit for performing level conversion of a timing pulse of a first voltage amplitude inputted from outside the board to a second voltage amplitude and supplying the level-converted timing pulse to the driving means,
the level converter circuit comprising:
a first circuit that is constantly in an operating state and performs level conversion of a first timing pulse that becomes active during a horizontal blanking period of an image signal, from the first voltage amplitude to the second voltage amplitude; and
a second circuit that is in an operating state during an active period of the first timing pulse using the first timing pulse after the level conversion b the first circuit and performs level conversion of a second timing pulse from the first voltage amplitude to the second voltage amplitude, and wherein the level converter circuit further comprises:
a timing control circuit for generating a control pulse that becomes active during the active period of the first timing pulse on the basis of the first and second timing pulses after the level conversion by the first and second circuits; and
a third circuit that is in an operating state during an active period of the control pulse using the control pulse and performs level conversion of a third timing pulse from the first voltage amplitude to the second voltage amplitude.

16. The portable telephone device as claimed in claim 15, wherein the third circuit includes plural circuit parts corresponding to plural said third timing pulses.

17. The portable telephone device as claimed in claim 15, wherein the timing control circuit generates first and second control pulses that become active at different timing during the active period of the first timing pulse, and
the third circuit is a sampling latch-type level shifter that is in a non-operating state during an active period of one of the first and second control pulses that is generated first and then takes the third timing pulse therein, and that is in an operating state when the control pulse is inactive, then latches the control pulse, and latches the latched data on a subsequent stage synchronously with the control pulse that is generated later.

18. The portable telephone device as claimed in claim 16, wherein one of the third timing pulses is a pulse that is active during one horizontal scanning period in one field period.

19. The portable telephone device as claimed in claim 18, wherein the level converter circuit further comprises a fourth circuit that is in an operating state during an active period of the third timing pulse using the third timing pulse after the level conversion by the third circuit and performs level conversion of a fourth timing pulse from the first voltage amplitude to the second voltage amplitude.

20. The portable telephone device as claimed in claim 19, wherein the fourth circuit includes plural circuit parts corresponding to plural said fourth timing pulses.

21. The portable telephone device as claimed in claim 15, wherein the display device is a liquid crystal display device using liquid crystal cells as display elements of the pixels.

22. A portable telephone device having an output display unit and using a liquid crystal display device as the output display unit,
the liquid crystal display device comprising:
a pixel unit having pixels arrayed in a matrix on a board and having signal lines arranged for each row of the pixel array;
selection means provided on the same board as the pixel unit and adapted for time-divisionally selecting a set of plural signal lines and supplying a signal thereto; and
level conversion means for converting a selector pulse with a first voltage amplitude inputted from outside the board to a second voltage amplitude and supplying the converted selector pulse to the selection means, the level conversion means being inactive when the selection means is in a non-selection state and wherein the level conversion means has a first level shifter that becomes active in response to an enable pulse allowing supply of a signal to the signal lines and performs level shift of a first shift pulse, a second level shifter that becomes active at timing of vanishing of the first shift pulse level-shifted by the first level shifter and performs level shift of a second shift pulse, and a third level shifter that becomes active at timing of vanishing of the second shift pulse level-shifted by the second level shifter and performs level shift of a third shift pulse, the first level shifter becoming inactive at timing of generation of the second shift pulse, the second level shifter becoming inactive at timing of generation of the third shift pulse, and the third level shifter becoming inactive at timing of vanishing of the enable pulse.

23. The portable telephone device as claimed in claim 22 wherein the level conversion means has an enable pulse level shifter that is constantly active, performs level shift of the enable pulse of the first voltage level inputted from outside of the board to the second voltage level and supplies the level-shifted enable pulse to the first level shifter.

* * * * *